United States Patent
Yu et al.

(10) Patent No.: US 11,532,365 B2
(45) Date of Patent: Dec. 20, 2022

(54) OPERATION METHOD OF NONVOLATILE MEMORY DEVICE

(71) Applicant: Samsung Electronics Co., Ltd., Suwon-si (KR)

(72) Inventors: Jae-Duk Yu, Seoul (KR); Sang-Wan Nam, Hwaseong-Si (KR); Jonghoon Park, Hwaseong-si (KR); Ho-Jun Lee, Uiwang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/377,141

(22) Filed: Jul. 15, 2021

(65) Prior Publication Data

US 2022/0130467 A1   Apr. 28, 2022

(30) Foreign Application Priority Data

Oct. 28, 2020   (KR) .......................... 10-2020-0141088

(51) Int. Cl.
| | |
|---|---|
| *G11C 16/08* | (2006.01) |
| *G11C 16/26* | (2006.01) |
| *H01L 25/065* | (2006.01) |
| *H01L 25/18* | (2006.01) |
| *H01L 23/00* | (2006.01) |
| *G11C 16/04* | (2006.01) |

(52) U.S. Cl.
CPC .......... *G11C 16/26* (2013.01); *G11C 16/0483* (2013.01); *G11C 16/08* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ..................................................... G11C 16/08
See application file for complete search history.

(56) References Cited

U.S. PATENT DOCUMENTS

| | | |
|---|---|---|
| 9,190,151 B2 | 11/2015 | Nam et al. |
| 9,620,232 B2 | 4/2017 | Nam |
| 9,837,164 B2 | 12/2017 | Yun |
| 10,210,941 B1 | 2/2019 | Chen et al. |
| 10,559,368 B1 | 2/2020 | Yang |
| 2019/0371403 A1 | 12/2019 | Maejima |
| 2020/0143883 A1 | 5/2020 | Joo et al. |
| 2020/0185041 A1* | 6/2020 | Baek ...................... G11C 16/08 |

* cited by examiner

*Primary Examiner* — Jason Lappas
(74) *Attorney, Agent, or Firm* — Muir Patent Law, PLLC

(57) ABSTRACT

An operation method of a nonvolatile memory device includes receiving a read command and an address, increasing a voltage applied to an unselected word line from an off voltage to a read pass voltage during a setup phase in response to the read command, increasing a voltage applied to an unselected string selection line from the off voltage to a pre-pulse voltage during a first setup phase of the setup phase, increasing a voltage applied to an unselected ground selection line from the off voltage to the pre-pulse voltage during the first setup phase, applying a read voltage to a selected word line to read data corresponding to the address, during a sensing phase following the setup phase, and outputting the read data through data lines after the sensing phase. During the setup phase, a slope of the voltage applied to the unselected word line is varied.

20 Claims, 18 Drawing Sheets

OPERATION METHOD OF NONVOLATILE MEMORY DEVICE

CROSS-REFERENCE TO RELATED APPLICATIONS

This application claims priority under 35 U.S.C. § 119 to Korean Patent Application No. 10-2020-0141088 filed on Oct. 28, 2020, in the Korean Intellectual Property Office, the disclosures of which are incorporated by reference herein in their entireties.

BACKGROUND

Embodiments of the present disclosure described herein relate to a semiconductor memory device, and more particularly, relate to an operation method of a nonvolatile memory device.

Semiconductor memory devices may be classified as a volatile memory, in which stored data disappear when a power is turned off, such as a static random access memory (SRAM) or a dynamic random access memory (DRAM), or a nonvolatile memory, in which stored data are retained even when a power is turned off, such as a flash memory, a phase change RAM (PRAM), a magnetic RAM (MRAM), a resistive RAM (RRAM), or a ferroelectric RAM (FRAM).

As semiconductor manufacturing technologies develop, there is a continuous increase in the degree of integration and capacity of a storage device. The high degree of integration of the storage device makes it possible to reduce costs necessary to manufacture the storage device. However, in the case where the storage device is scaled down due to the high degree of integration thereof, various new issues may occur. In particular, due to various issues, various technologies for securing the reliability of the nonvolatile memory device and the storage device may be applied to the nonvolatile memory device and the storage device.

As new technologies for securing the reliability are applied to the nonvolatile memory device and the storage device, a speed at which the nonvolatile memory device and the storage device operate may decrease, and a peak current may increase.

SUMMARY

Embodiments of the present disclosure provide an operation method of a nonvolatile memory device which secures reliability and reduces a peak current while improving an operating speed, by adjusting the balance between the reliability, the operating speed, and the peak current.

According to an embodiment, an operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method includes receiving a read command and an address from an external device, increasing a voltage applied to an unselected word line from an off voltage to a read pass voltage during a setup phase in response to the read command, increasing a voltage applied to an unselected string selection line from the off voltage to a pre-pulse voltage during a first setup phase of the setup phase, increasing a voltage applied to an unselected ground selection line from the off voltage to the pre-pulse voltage during the first setup phase, applying a read voltage to a selected word line to read data corresponding to the address, during a sensing phase following the setup phase, and outputting the read data through data lines after the sensing phase. During the setup phase, a slope of the voltage applied to the unselected word line is varied.

According to an embodiment, an operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method includes receiving a read command and an address from an external device, increasing a voltage applied to an unselected word line from an off voltage to a read pass voltage during a setup phase in response to the read command, increasing a voltage applied to an unselected string selection line from the off voltage to a pre-pulse voltage during a first time period of the setup phase, increasing a voltage applied to an unselected ground selection line from the off voltage to the pre-pulse voltage during the first time period, increasing a voltage applied to a selected word line from the off voltage to the pre-pulse voltage during a second time period of the setup phase, which is different from the first time period, applying a read voltage to the selected word line to read data corresponding to the address, during a sensing phase following the setup phase, and outputting the read data through data lines after the sensing phase.

According to an embodiment, an operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method includes receiving a read command and an address from an external device, increasing a voltage applied to an unselected string selection line from an off voltage to a pre-pulse voltage during a first pre-pulse phase of a setup phase, in response to the read command, increasing a voltage applied to an unselected ground selection line from the off voltage to the pre-pulse voltage during the first pre-pulse phase, increasing a voltage applied to a selected word line from the off voltage to the pre-pulse voltage during a second pre-pulse phase of the setup phase, which is different from the first pre-pulse phase, increasing a voltage applied to an unselected word line from the off voltage to a read pass voltage while changing a slope of the voltage applied to the unselected word line, during the setup phase, applying the read voltage to the selected word line to read data corresponding to the address, during a sensing phase following the setup phase, and outputting the read data through data lines after the sensing phase.

BRIEF DESCRIPTION OF THE FIGURES

The above and other objects and features of the present disclosure will become apparent by describing in detail embodiments thereof with reference to the accompanying drawings.

DETAILED DESCRIPTION

Below, embodiments of the present disclosure may be described in detail and clearly to such an extent that one skilled in the art easily implements the present disclosure.

Figure 1:
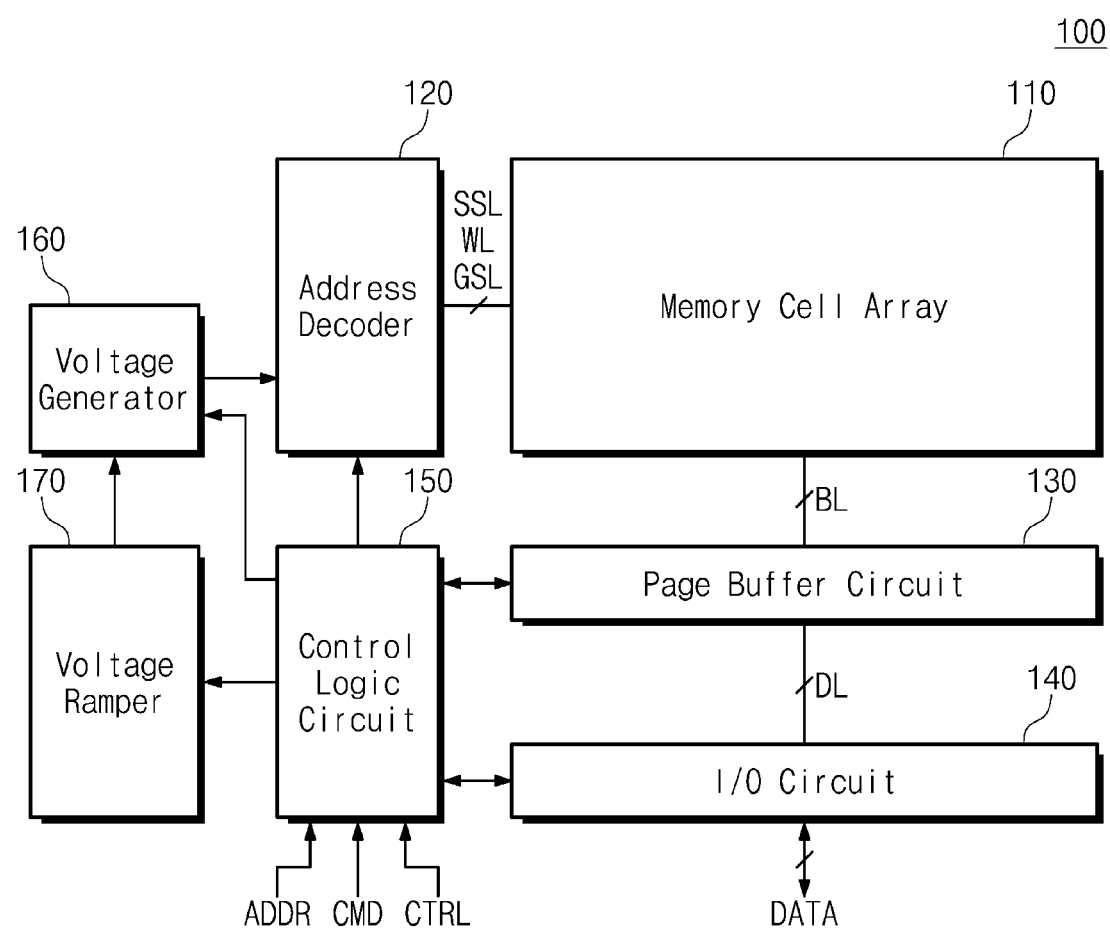
FIG. 1 is a block diagram illustrating a nonvolatile memory device according to an embodiment of the present disclosure.

FIG. 1 is a block diagram illustrating a nonvolatile memory device. Referring to FIG. 1, a nonvolatile memory device 100 may include a memory cell array 110, an address decoder 120, a page buffer circuit 130, an input/output circuit 140, a control logic circuit 150, a voltage generator 160, and a voltage ramper 170.

The memory cell array 110 may include a plurality of memory blocks. Each of the plurality of memory blocks may include a plurality of cell strings, the plurality of cell strings may be connected to bit lines BL, and each of the plurality of cell strings may include a plurality of cell transistors connected in series. The plurality of cell transistors may be connected to word lines WL, string selection lines SSL, and ground selection lines GSL.

The address decoder 120 may be connected to the memory cell array 110 through the string selection lines SSL, the word lines WL, and the ground selection lines GSL. The address decoder 120 may decode an address ADDR received from a memory controller through the control logic circuit 150 and may control the string selection lines SSL, the word lines WL, and the ground selection lines GSL based on the decoded result. For example, the address decoder 120 may receive various voltages from the voltage generator 160. The address decoder 120 may decode the received address ADDR and may provide relevant voltages to the string selection lines SSL, the word lines WL, and the ground selection lines GSL based on the decoded address.

The page buffer circuit 130 may be connected to the memory cell array 110 through bit lines BL. The page buffer circuit 130 may temporarily store data to be stored in memory cells of the memory cell array 110 through the bit lines BL. Alternatively, the page buffer circuit 130 may control voltage levels of the bit lines BL based on data received from the input/output circuit 140 through data lines DL.

The input/output circuit 140 may receive data from the page buffer circuit 130 through the data lines DL and may transfer the received data to the memory controller. Alternatively, the input/output circuit 140 may transfer data received from the memory controller to the page buffer circuit 130 through the data lines DL.

The control logic circuit 150 may control components of the nonvolatile memory device 100 in response to the address ADDR, a command CMD and a control signal CTRL from the memory controller. In an embodiment, the control logic circuit 150 may independently perform a pre-pulse operation of a selected word line and a pre-pulse operation of unselected word lines. For example, a pre-pulse phase of a selected word line and a pre-pulse phase of unselected word lines may be different.

The voltage generator 160 may generate various voltages necessary for the nonvolatile memory device 100 to operate. For example, in a read operation, a program operation, or an erase operation, the voltage generator 160 may be configured to generate various voltages to be applied to the memory cell array 110. Various voltages to be described below may be generated by the voltage generator 160 and may be provided to the string selection lines SSL, the word lines WL, and the ground selection lines GSL through the address decoder 120 or to a substrate where the nonvolatile memory device 100 is formed.

The voltage ramper 170 may be configured to control various voltages to be provided to the string selection lines SSL, the word lines WL, and the ground selection lines GSL. For example, the voltage ramper 170 may adjust a slope of a read pass voltage that is applied to unselected word lines in a read operation. The voltage ramper 170 may control a time when a voltage of an unselected word line increases from an off voltage VOFF to a read pass voltage VREAD and a speed at which the unselected word line is charged to the read pass voltage VREAD. A peak current may be prevented from increasing by controlling a slope of a voltage.

The voltage ramper 170 may receive information about a cycle, a step, a start level, and a target level. The start level indicates an initial voltage level, and the target level indicates a target voltage level. When a voltage increases from the initial voltage level to the target voltage level, a voltage increasing period and a voltage maintaining period may be repeated. The step indicates the degree to which a voltage increases in the voltage increasing period. The cycle indicates a time when the voltage is maintained in the voltage maintaining period.

The voltage ramper 170 may allow a voltage to increase from the initial voltage level to the target voltage level, based on the received information. The voltage ramper 170 may adjust a rising slope of a voltage based on the step and the cycle. For example, as the voltage ramper 170 decreases the cycle, a rising slope of a voltage may increase. Alternatively, as the voltage ramper 170 increases the step, a rising slope of a voltage may increase.

Figure 2:
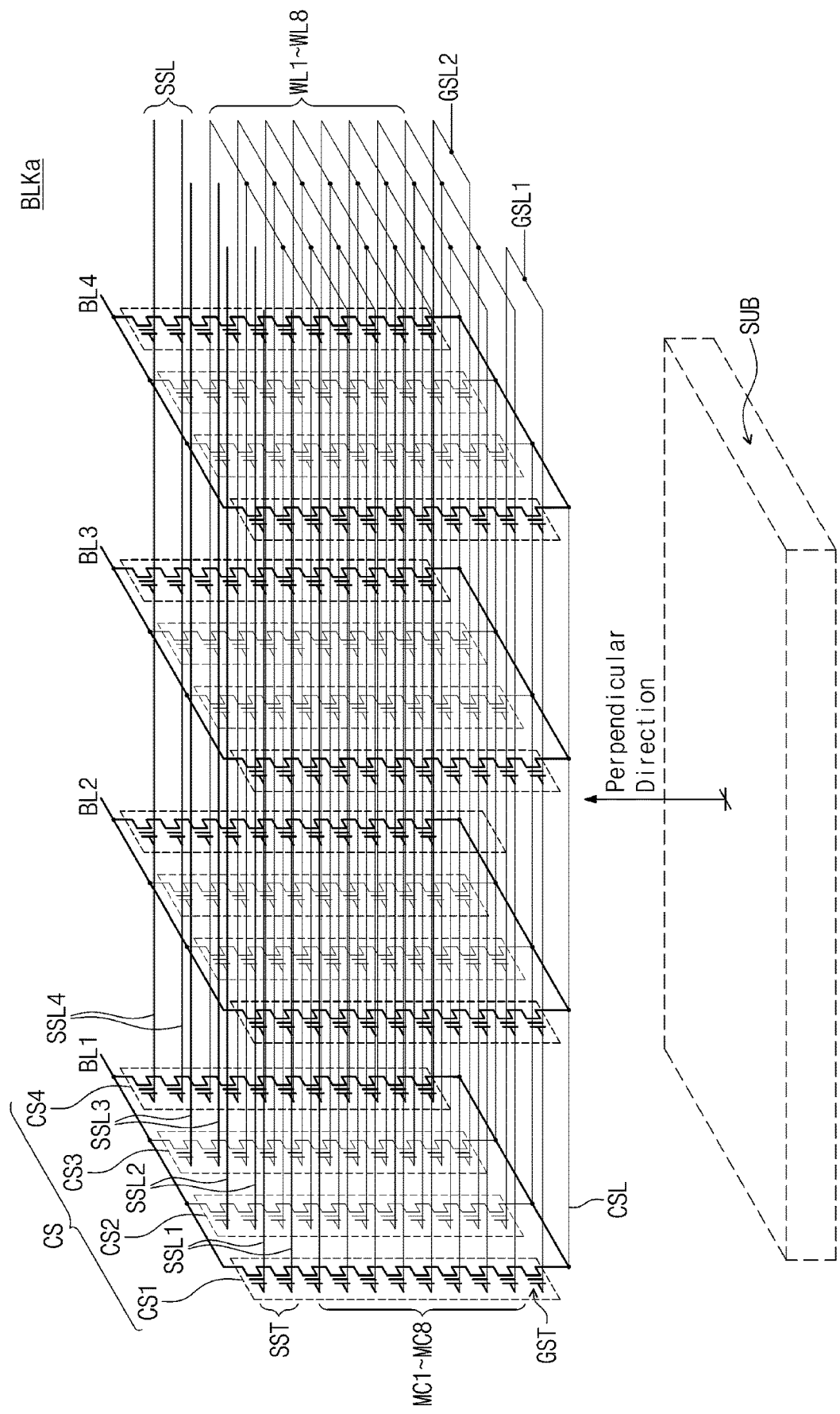
FIG. 2 is a circuit diagram illustrating an example of one memory block of memory blocks of FIG. 1 according to example embodiments.

FIG. 2 is a circuit diagram illustrating an example of one memory block BLKa of memory blocks of FIG. 1 according to example embodiments. Referring to FIGS. 1 and 2, a plurality of cell strings CS may be arranged on a substrate SUB in rows and columns. The plurality of cell strings CS may be connected to a common source line CSL formed on (or in) the substrate SUB in common. For better understanding of a structure of the memory block BLKa, a location of the substrate SUB is illustrated in FIG. 2 by way of example.

An example is illustrated in FIG. 2 as the common source line CSL is connected with lower ends (or lower portions) of the cell strings CS. However, it is sufficient if the common source line CSL is electrically connected to the lower ends of the cell strings CS, and the present disclosure is not limited to the case that the common source line CSL is physically located at the lower ends of the cell strings CS. An example is illustrated in FIG. 2 as the cell strings CS are arranged in a 4×4 matrix. However, the number of cell strings CS in the memory block BLKa may increase or decrease.

The cell strings CS of each row may be connected to a ground selection line GSL1 or GSL2 in common. For example, the cell strings CS of first and second rows may be connected to the first ground selection line GSL1 in common, and the cell strings CS of third and fourth rows may be connected to the second ground selection line GSL2 in common.

The cell strings CS of each row may be connected to a relevant string selection line of first to fourth string selection lines SSL1 to SSL4. The cell strings CS of each column may be connected to a relevant bit line of first to fourth bit lines BL1 to BL4. To prevent a drawing from being complicated, the cell strings CS connected to the second and third string selection lines SSL2 and SSL3 are depicted to be blurred.

Each of the cell strings CS may include at least one ground selection transistor GST connected to the ground selection line GSL1 or GSL2, a plurality of memory cells MC1 to MC8 respectively connected to a plurality of word lines WL1 to WL8, and string selection transistors SST respectively connected with the string selection lines SSL1, SSL2, SSL3, or SSL4. Herein, two string selection transistors SST of each cell string CS are connected in series, however, the present disclosure is not limited thereto. For example, each cell string CS has one string selection transistor SST.

In each cell string CS, the ground selection transistor GST, the memory cells MC1 to MC8, and the string selection transistors SST may be connected in series in a direction perpendicular to the substrate SUB and may be sequentially stacked in the direction perpendicular to the substrate SUB. In each cell string CS, at least one of the memory cells MC1 to MC8 may be used as a dummy memory cell. The dummy memory cell may not be programmed (e.g., may be pro-gram-inhibited) or may be programmed differently from the remaining memory cells of the memory cells MC1 to MC8.

In an embodiment, memory cells that are placed at the same height and belong to the cell strings CS of each row may form one physical page. Memory cells of one physical page may be connected to one sub-word line. Sub-word lines of physical pages placed at the same height may be connected to one word line in common.

In an embodiment, sub-word lines of physical pages placed at the same height may be connected to each other at a height at which the sub-word lines are formed. For example, sub-word lines of physical pages placed at the same height may be indirectly connected to each other in any other layer, which has a height different from a height at which the sub-word lines are formed, such as a metal layer.

Figure 3:
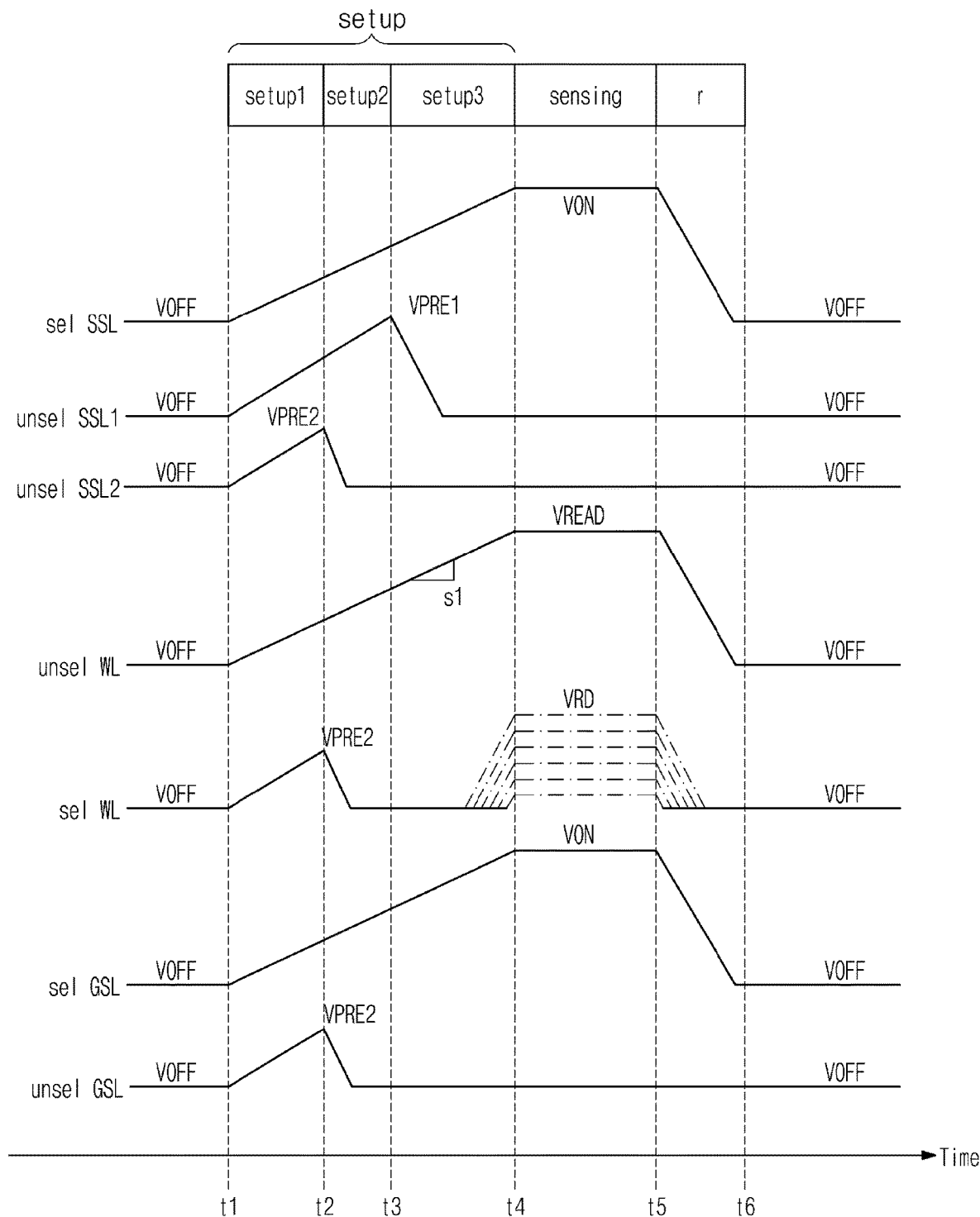
FIG. 3 illustrates an example of voltages applied to a memory block of FIG. 2 in a read operation according to example embodiments.

FIG. 3 illustrates an example of voltages applied to the memory block BLKa of FIG. 2 in a read operation according to example embodiments. Referring to FIGS. 1 to 3, the fourth word line WL4 and the second string selection line SSL2 may be selected. For example, memory cells that are defined by the fourth word line WL4 and the second string selection line SSL2 may be selected as a target of a read operation.

A selected string selection line sel SSL indicates a string selection line, which is connected to a cell string including a cell transistor targeted for a program or read operation, from among a plurality of string selection lines. For example, the selected string selection line sel SSL may include the second string selection line SSL2. An unselected string selection line unsel SSL indicates the remaining string selection line or the remaining string selection lines of the plurality of string selection lines except for the selected string selection line. The unselected string selection line unsel SSL may include the first, third, and fourth string selection lines SSL1, SSL3, and SSL4.

A selected word line sel WL indicates a word line, which is connected to the cell transistor targeted for the program or read operation, from among a plurality of word lines. For example, the selected word line sel WL may include the fourth word line WL4. An unselected word line unsel WL indicates the remaining word line or the remaining word lines of the plurality of word lines except for the selected word line. For example, the unselected word line unsel WL may include the first to third word lines WL1 to WL3 and the fifth to eighth word lines WL5 to WL8.

A selected ground selection line sel GSL indicates a ground selection line, which is connected to the cell string including the cell transistor targeted for the program or read operation, from among a plurality of ground selection lines. For example, the selected ground selection line sel GSL may include the first ground selection line GSL1. An unselected ground selection line unsel GSL indicates the remaining ground selection line or the remaining ground selection lines of the plurality of ground selection lines except for the selected ground selection line. For example, the unselected ground selection line unsel GSL may include the second ground selection line GSL2.

A first unselected string selection line unsel SSL1 indicates an unselected string selection line corresponding to the selected ground selection line sel GSL from among the unselected string selection lines unsel SSL. For example, the first unselected string selection line unsel SSL1 may include the first string selection line SSL1. A second unselected string selection line unsel SSL2 indicates an unselected string selection line corresponding to the unselected ground selection line unsel GSL from among the unselected string selection lines unsel SSL. For example, the second unselected string selection line unsel SSL2 may include the third and fourth string selection lines SSL3 and SSL4.

A voltage that is applied to the selected string selection line sel SSL may increase from the off voltage VOFF to an on voltage VON from a first time point t1 to a fourth time point t4 (i.e., a setup phase "setup" or setup1 to setup3). The voltage that is applied to the selected string selection line sel SSL may be maintained at the on voltage VON from the fourth time point t4 to a fifth time point t5 (i.e., a sensing phase "sensing"). The voltage that is applied to the selected string selection line sel SSL may decrease from the on voltage VON to the off voltage VOFF from the fifth time point t5 to a sixth time point t6 (i.e., a recovery phase "r").

A voltage that is applied to the first unselected string selection line unsel SSL1 may increase from the off voltage VOFF to a first pre-pulse voltage VPRE1 from the first time point t1 to a third time point t3. The voltage that is applied to the first unselected string selection line unsel SSL1 may decrease from the first pre-pulse voltage VPRE1 to the off voltage VOFF after the third time point t3. Afterwards, the voltage that is applied to the first unselected string selection line unsel SSL1 may be maintained at the off voltage VOFF.

A voltage that is applied to the second unselected string selection line unsel SSL2 may increase from the off voltage VOFF to a second pre-pulse voltage VPRE2 from the first time point t1 to a second time point t2. After the second time point t2, the voltage that is applied to the second unselected string selection line unsel SSL2 may decrease from the second pre-pulse voltage VPRE2 to the off voltage VOFF. Afterwards, the voltage that is applied to the second unselected string selection line unsel SSL2 may be maintained at the off voltage VOFF.

A voltage that is applied to the unselected word line unsel WL may increase from the off voltage VOFF to the read pass voltage VREAD from the first time point t1 to the fourth time point t4. For example, the voltage that is applied to the unselected word line unsel WL may increase at a first slope s1. The voltage that is applied to the unselected word line unsel WL may be maintained at the read pass voltage VREAD from the fourth time point t4 to the fifth time point t5. Afterwards, the voltage that is applied to the unselected word line unsel WL may decrease from the read pass voltage VREAD to the off voltage VOFF from the fifth time point t5 to the sixth time point t6.

A voltage that is applied to the selected word line sel WL may increase from the off voltage VOFF to the second pre-pulse voltage VPRE2 from the first time point t1 to the second time point t2. After the second time point t2, the voltage that is applied to the selected word line sel WL may decrease from the second pre-pulse voltage VPRE2 to the off voltage VOFF. Afterwards, the voltage that is applied to the selected word line sel WL may increase from the off voltage VOFF to a read voltage VRD. The voltage that is applied to the selected word line sel WL may be maintained at the read voltage VRD from the fourth time point t4 to the fifth time point t5. The voltage that is applied to the selected word line sel WL may decrease from the read voltage VRD to the off voltage VOFF after the fifth time point t5.

A voltage that is applied to the selected ground selection line sel GSL may increase from the off voltage VOFF to the on voltage VON from the first time point t1 to the fourth time point t4. The voltage that is applied to the selected ground selection line sel GSL may be maintained at the on voltage VON from the fourth time point t4 to the fifth time point t5. The voltage that is applied to the selected ground selection line sel GSL may decrease from the on voltage VON to the off voltage VOFF from the fifth time point t5 to the sixth time point t6.

A voltage that is applied to the unselected ground selection line unsel GSL may increase from the off voltage VOFF to the second pre-pulse voltage VPRE2 from the first time point t1 to the second time point t2. After the second time point t2, the voltage that is applied to the unselected ground selection line unsel GSL may decrease from the second pre-pulse voltage VPRE2 to the off voltage VOFF. Afterwards, the voltage that is applied to the unselected ground selection line unsel GSL may be maintained at the off voltage VOFF.

The off voltage VOFF may turn off transistors connected to respective lines. Levels of the off voltages VOFF respectively applied to the lines may be the same as or different from each other. For example, a level of the off voltage VOFF applied to the first unselected string selection line unsel SSL1 may be different from a level of the off voltage VOFF applied to the second unselected string selection line unsel SSL2. A level of the off voltage VOFF applied to the string selection transistor SST adjacent to the first bit line BL1 may be different from a level of the off voltage VOFF applied to the string selection transistor SST adjacent to the eighth memory cell MC8.

The on voltage VON may turn on transistors connected to respective lines. Levels of the on voltages VON respectively applied to the lines may be the same as or different from each other. For example, a level of the on voltage VON applied to the selected string selection line sel SSL may be different from a level of the on voltage VON applied to the selected ground selection line sel GSL. A level of the on voltage VON applied to the string selection transistor SST adjacent to the first bit line BL1 may be different from a level of the on voltage VON applied to the string selection transistor SST adjacent to the eighth memory cell MC8.

The read pass voltage VREAD may be a high voltage greater than threshold voltages of the memory cells MC1 to MC8. Levels of the read pass voltages VREAD respectively applied to the unselected word lines unsel WL may be the same as or different from each other. For example, a level of the read pass voltage VREAD applied to the first word line WL1 may be different from a level of the read pass voltage VREAD applied to the eighth word line WL8. The read voltage VRD may have one of various levels depending on a target of a read operation as marked by a dash-single dotted line. For example, the read voltage VRD may have one of various levels depending on a selected cell data.

The first and second pre-pulse voltages VPRE1 and VPRE2 may turn on the string selection transistor SST and the ground selection transistors GST. The first and second pre-pulse voltages VPRE1 and VPRE2 may be smaller than the read pass voltage VREAD. Levels of the first and second pre-pulse voltages VPRE1 and VPRE2 may change depending on a location where the first and second pre-pulse voltages VPRE1 and VPRE2 are applied and a kind of the first and second pre-pulse voltages VPRE1 and VPRE2. The level of the first pre-pulse voltage VPRE1 may be higher than the level of the second pre-pulse voltage VPRE2. However, the present disclosure is not limited thereto, the level of the first pre-pulse voltage VPRE1 may be the same as the level of the second pre-pulse voltage VPRR2.

The pre-pulse phase indicates a phase where voltages applied to respective lines increase from the off voltage VOFF to the first and second pre-pulse voltages VPRE1 and VPRE2. For example, the pre-pulse phase of the first unselected string selection line unsel SSL1 may be from the first time point t1 to the third time point t3. The pre-pulse phase of the second unselected string selection line unsel SSL2, the selected word line sel WL, and the unselected ground selection line unsel GSL may be from the first time point t1 to the second time point t2.

The read operation may include the setup phase "setup", the sensing phase "sensing", and the recovery phase "r". The setup phase "setup" indicates a phase where a voltage applied to the unselected word line unsel WL increases from the off voltage VOFF to the read pass voltage VREAD. The sensing phase "sensing" indicates a phase where a voltage applied to the unselected word line unsel WL is maintained at the read pass voltage VREAD. The recovery phase "r" indicates a phase where the voltage applied to the unselected word line unsel WL decreases from the read pass voltage VREAD to the off voltage VOFF.

The setup phase "setup" may include first to third setup phases setup1 to setup3. The first setup phase "setup1" indicates a phase where a pre-pulse voltage is applied to the first unselected string selection line unsel SSL1, the second unselected string selection line unsel SSL2, the selected word line sel WL, and the unselected ground selection line unsel GSL and a read pass voltage is applied to the unselected word line unsel WL. For example, the first setup phase "setup1" may be from the first time point t1 to the second time point t2.

The second setup phase "setup2" indicates a phase where a pre-pulse voltage is applied to the first unselected string selection line unsel SSL1 and a read pass voltage is applied to the unselected word line unsel WL. For example, the second setup phase "setup2" may be from the second time point t2 to the third time point t3. The third setup phase "setup3" indicates a phase where a pre-pulse voltage is not applied to the first unselected string selection line unsel SSL1, the second unselected string selection line unsel SSL2, and the unselected ground selection line unsel GSL and a read pass voltage is applied to the unselected word line unsel WL. For example, the third setup phase "setup3" may be from the third time point t3 to the fourth time point t4.

The address decoder 120 may apply a pre-pulse voltage to each of the first unselected string selection line unsel SSL1, the second unselected string selection line unsel SSL2, the unselected ground selection line unsel GSL, and the selected word line sel WL and may then apply the off voltage VOFF thereto. A pre-pulse voltage may start to be applied simultaneously with the read pass voltage VREAD.

Figure 4:
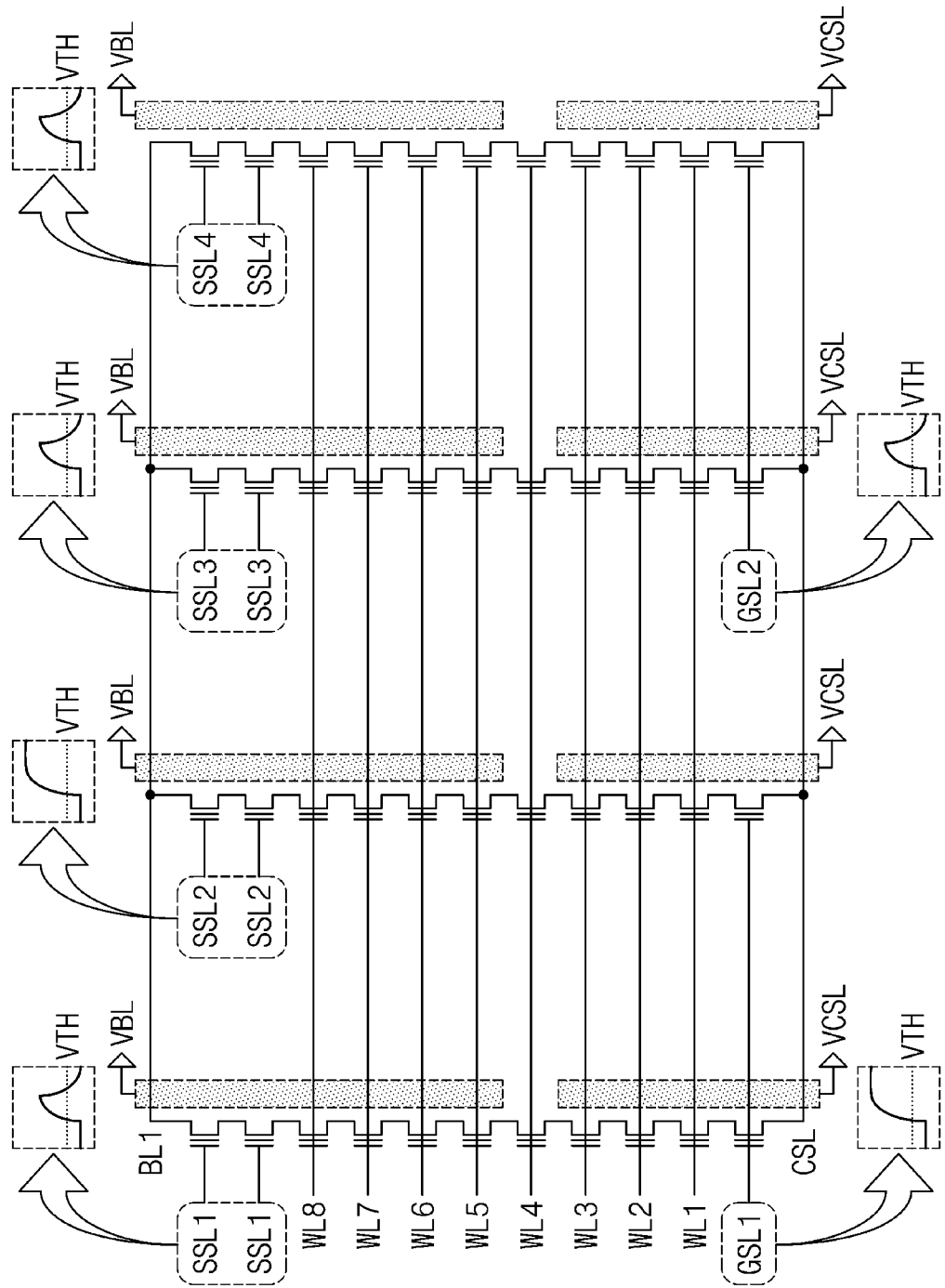
FIG. 4 illustrates an example in which voltages of FIG. 3 are applied to cell strings of a first column of a memory block according to example embodiments.

FIG. 4 illustrates an example in which voltages of FIG. 3 are applied to cell strings of a first column of the memory block BLKa according to example embodiments. Referring to FIGS. 3 and 4, shaded boxes indicate channels formed at cell strings. For example, it is assumed that the fourth memory cells MC4 are turned off when the read voltage VRD is applied to the fourth word line WL4, but the present disclosure is not limited thereto.

For comparison, timings of some of voltages applied to the first to fourth string selection lines SSL1 to SSL4 and the first and second ground selection lines GSL1 and GSL2 are illustrated in FIG. 2 together with threshold voltages VTH of the string selection transistors SST and the ground selection transistors GST, by way of example.

While the pre-pulse voltages VPRE1 and VPRE2 are applied to the first, third, and fourth string selection lines SSL1, SSL3, and SSL4 unselected (hereinafter referred to as "unselected string selection lines SSL1, SSL3, and SSL4") as described above, string selection transistors connected to the unselected string selection lines SSL1, SSL3, and SSL4 are turned on. Voltages of upper channels corresponding to the unselected string selection lines SSL1, SSL3, and SSL4 may be initialized to a bit line voltage VBL.

In the case where the off voltage VOFF is applied to the unselected string selection lines SSL1, SSL3, and SSL4, voltages of the upper channels corresponding to the unselected string selection lines SSL1, SSL3, and SSL4 may be boosted by the read pass voltage VREAD.

Likewise, while the pre-pulse voltage VPRE2 is applied to the second ground selection line GSL2 unselected (hereinafter referred to as an "unselected ground selection line GSL2"), the ground selection transistors GST connected to the unselected ground selection line GSL2 are turned on. Voltages of lower channels corresponding to the unselected ground selection line GSL2 may be initialized to a common source line voltage VCSL.

In the case where the off voltage VOFF is applied to the unselected ground selection line GSL2, the ground selection transistors GST connected to the unselected ground selection line GSL2 are turned off. Afterwards, the voltages of the lower channels corresponding to the unselected ground selection line GSL2 may be boosted by the read pass voltage VREAD.

As described above, voltages of the upper channels are initialized to the bit line voltage VBL, and voltages of the lower channels are initialized to the common source line voltage VCSL. Accordingly, the boosted voltages of the upper channels and the boosted voltages of the lower channels may be adjusted to be similar by controlling the bit line voltage VBL and the common source line voltage VCSL to be similar. For example, the degradation of data due to hot carrier injection may be prevented.

While a pre-pulse voltage is applied, voltages of the upper channels are maintained at the bit line voltage VBL, and voltages of the lower channels are maintained at the common source line voltage VCSL. Because a parasitic capacitor may be present between a channel and the first to eighth word lines WL1 to WL8, a setup time of word lines may increases, and a peak current may increase.

As the upper channels and the lower channels act as a parasitic capacitor, a time taken for voltages of the first to eighth word lines WL1 to WL8 to reach a target level of the read pass voltage VREAD may increases, and power consumption or a peak current may increase. For example, in the embodiments of FIGS. 3 and 4, the reliability of data may be secured, but the following issues may occur such as a speed of a read operation decreases, power consumption increases, and a peak current increases.

In the following drawings, as described with reference to FIG. 3, it is assumed that the second string selection line SSL2 and the fourth word line WL4 are selected by the address ADDR.

Figure 5:
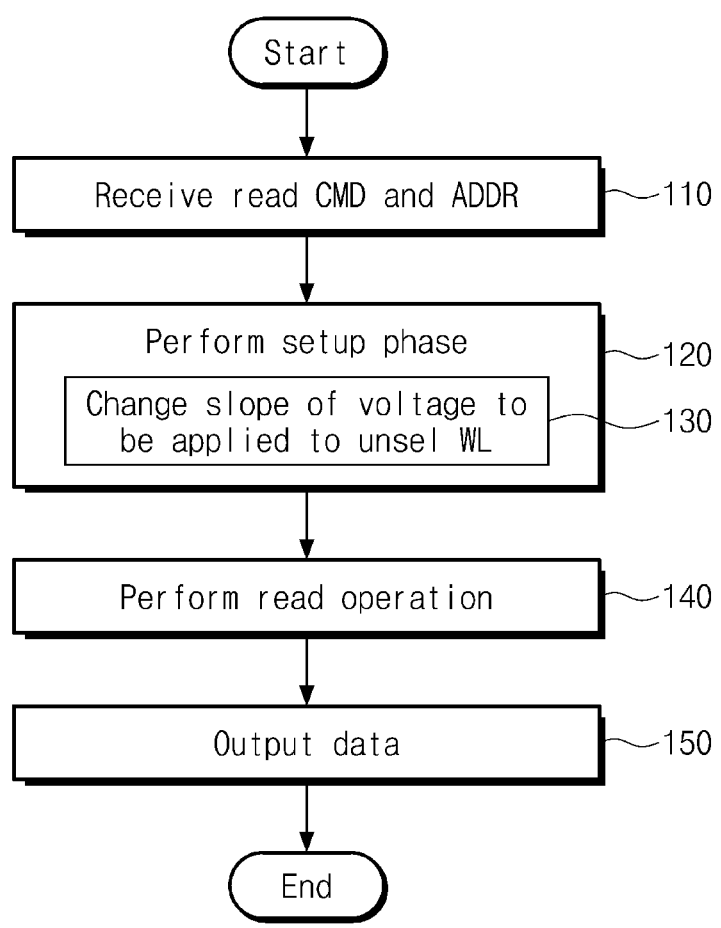
FIG. 5 is a flowchart illustrating a read operation of a nonvolatile memory device of FIG. 1 according to example embodiments.

FIG. 5 is a flowchart illustrating a read operation of a nonvolatile memory device of FIG. 1 according to example embodiments. Referring to FIGS. 1 and 5, in operation S110, the nonvolatile memory device 100 may receive the command CMD and the address ADDR from the memory controller. For example, the nonvolatile memory device 100 may receive a read command CMD and the address ADDR through data lines DQ (or, signal lines) in synchronization with a write enable signal (e.g., /WE).

In operation S120, the nonvolatile memory device 100 may perform a setup phase in response to the read command CMD. In the setup phase, the nonvolatile memory device 100 may adjust voltages to be applied to the string selection line SSL, the word line WL, and the ground selection line GSL. For example, in the setup phase, the nonvolatile memory device 100 may apply the on voltage VON to the selected string selection line sel SSL and the selected ground selection line sel GSL. A voltage of the unselected word line unsel WL may increase from the off voltage VOFF to the read pass voltage VREAD. The nonvolatile memory device 100 may apply the pre-pulse voltage VPRE to the unselected string selection line unsel SSL, the unselected ground selection line unsel GSL, and the selected word line sel WL.

In operation S130, the nonvolatile memory device 100 may change a slope of a voltage to be applied to the unselected word line unsel WL. The nonvolatile memory device 100 may adjust a speed or a slope at which a voltage to be applied to the unselected word line unsel WL increases. For example, the setup phase "setup" may be divided into the first to third setup phases setup1 to setup3. During the first setup phase "setup1", a voltage applied to the unselected word line unsel WL may slowly increase. During the third setup phase "setup3", a voltage applied to the unselected word line unsel WL may quickly increase.

In an embodiment, during the first setup phase "setup1", a pre-pulse voltage may be applied to the first and second unselected string selection lines unsel SSL1 and unsel SSL2, the selected word line sel WL, and the unselected ground selection line unsel GSL. Accordingly, the nonvolatile memory device 100 may reduce a peak current by applying a voltage of a small rising slope to the unselected word line unsel WL during the first setup phase "setup1".

In an embodiment, during the third setup phase "setup3", a pre-pulse voltage may not be applied to the first and second unselected string selection lines unsel SSL1 and unsel SSL2, the selected word line sel WL, and the unselected ground selection line unsel GSL. Accordingly, even though a peak current increases, the nonvolatile memory device 100 may reduce a setup time by applying a voltage of a great rising slope to the unselected word line unsel WL during the third setup phase "setup3".

In operation S140, the nonvolatile memory device 100 may perform a read operation. For example, data corresponding to a received address may be sensed or read while a voltage of the unselected word line unsel WL is maintained at the read pass voltage VREAD and a voltage of the selected word line sel WL is maintained at the read voltage VRD.

In operation S150, the nonvolatile memory device 100 may output the read data. For example, the nonvolatile memory device 100 may output the read data to the memory controller though the data lines DQ in synchronization with a data strobe signal DQS.

Figure 6:
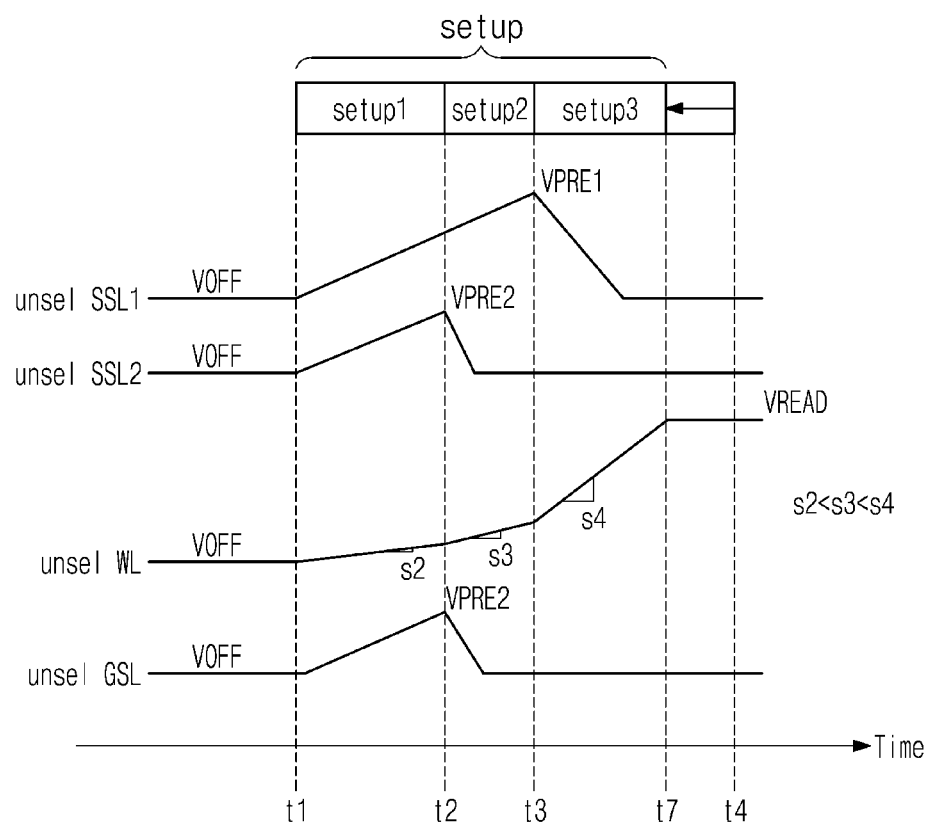
FIG. 6 illustrates an example of voltages applied to a memory block of FIG. 2 during a setup phase of FIG. 3 according to example embodiments.

FIG. 6 illustrates an example of voltages applied to the memory block BLKa of FIG. 2 during a setup phase of FIG. 3 according to example embodiments. For convenience of description and for brevity of drawing, in FIG. 6, the first and second unselected string selection lines unsel SSL1 and unsel SSL2, the unselected word line unsel WL, and the unselected ground selection line unsel GSL are illustrated, and the remaining lines are omitted. Referring to FIGS. 1 to 3 and 6, a slope of a voltage that is applied to the unselected word line unsel WL may change.

In an embodiment, the voltage that is applied to the unselected word line unsel WL may increase from the off voltage VOFF to the read pass voltage VREAD during the setup phase "setup". During the first setup phase "setup1", the voltage of the unselected word line unsel WL may increase at a second slope s2. During the second setup phase "setup2", the voltage of the unselected word line unsel WL may increase at a third slope s3. During the third setup phase "setup3", the voltage of the unselected word line unsel WL may increase at a fourth slope s4. The second slope s2 may be smaller than the first slope s1. The third slope s3 may be greater than the second slope s2. The fourth slope s4 may be greater than the first to third slopes s1 to s3.

Compared to FIG. 3, at a seventh time point t7 preceding the fourth time point t4, the voltage of the unselected word line unsel WL may reach a level of the read pass voltage VREAD. For example, a time period of the setup phase "setup" may decrease. Because the fourth slope s4 is greater than the first slope s1, during the third setup phase "setup3", the voltage of the unselected word line unsel WL may reach a level of the read pass voltage VREAD within a shorter time than that of FIG. 3.

Figure 7:
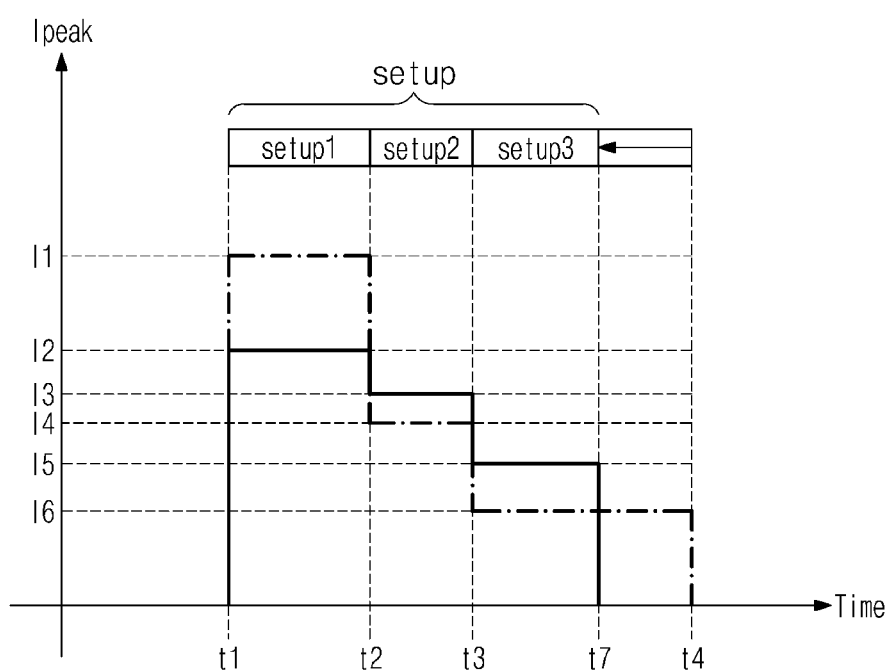
FIG. 7 is a graph illustrating a peak current over time according to example embodiments.

FIG. 7 is a graph illustrating a peak current over time according to example embodiments. The case where a peak current decreases in the first setup phase "setup1" by adjusting a rising slope of a voltage applied to the unselected word line unsel WL will be described with reference to FIG. 7. In FIG. 7, a horizontal axis represents a time, and a vertical axis represents a peak current. In the graph of FIG. 7, a dash-single dotted line indicates a peak current when a voltage applied to the unselected word line unsel WL increases at a uniform slope. In the graph of FIG. 7, a bold line indicates a peak current when a voltage applied to the unselected word line unsel WL increases at different slopes in respective phases.

While a pre-pulse voltage is applied, a peak current may increase due to parasitic capacitors of channels. In an embodiment, in the case where the voltage applied to the unselected word line unsel WL increases at a uniform slope in the setup phase "setup", a peak current in the first setup phase "setup1" may be a first current I1. A peak current in the second setup phase "setup2" may be a fourth current I4. A peak current in the third setup phase "setup3" may be a sixth current I6. The first current I1 may be four times the sixth current I6. The fourth current I4 may be two times the sixth current I6. However, the present disclosure is not limited thereto.

A peak current may be determined depending on the number of cell strings where upper channels and lower channels are formed. During the first setup phase "setup1", upper channels and lower channels of first to fourth cell strings CS1 to CS4 included in a first column may be formed. During the second setup phase "setup2", the upper channels and the lower channels of the first and second cell strings CS1 and CS2 may be formed. During the third setup phase "setup3", the upper channel and the lower channel of the second cell string CS2 may be formed. Accordingly, the first current I1 being a peak current of the first setup phase "setup1" may be the largest, and the sixth current I6 may be the smallest.

Due to a limited peak current of a nonvolatile memory device, a rising speed of a voltage of the unselected word line unsel WL may be determined based on the first current I1. Voltages of the unselected word lines unsel WL may increase at the first slope s1. For example, the first slope s1 may be determined depending on a peak current allowable during the first setup phase "setup1".

In the case where a voltage applied to the unselected word line unsel WL increases at different slopes in respective setup phases, a peak current in the first setup phase "setup1" may be a second current I2. A peak current in the second setup phase "setup2" may be a third current I3. A peak current in the third setup phase "setup3" may be a fifth current I5.

Because the voltage applied to the unselected word line unsel WL of FIG. 6 increases at the second slope s2 smaller than the first slope s1 during the first setup phase "setup1", the second current I2 may be smaller than the first current I1.

As described above, the voltage of the unselected word lines unsel WL of FIG. 3 may increase at a uniform slope (e.g., s1). For example, during the first to third setup phases setup1 to setup3, the voltage of the unselected word line unsel WL may increase at the same slope (e.g., s1). In contrast, the voltage of the unselected word line unsel WL of FIG. 6 may be variable or may change. As the nonvolatile memory device 100 adjusts a rising speed or slope of a voltage of the unselected word line unsel WL, a peak current in the first setup phase "setup1" may decrease, and a time taken to perform the third setup phase "setup3" may decrease.

Figure 8:
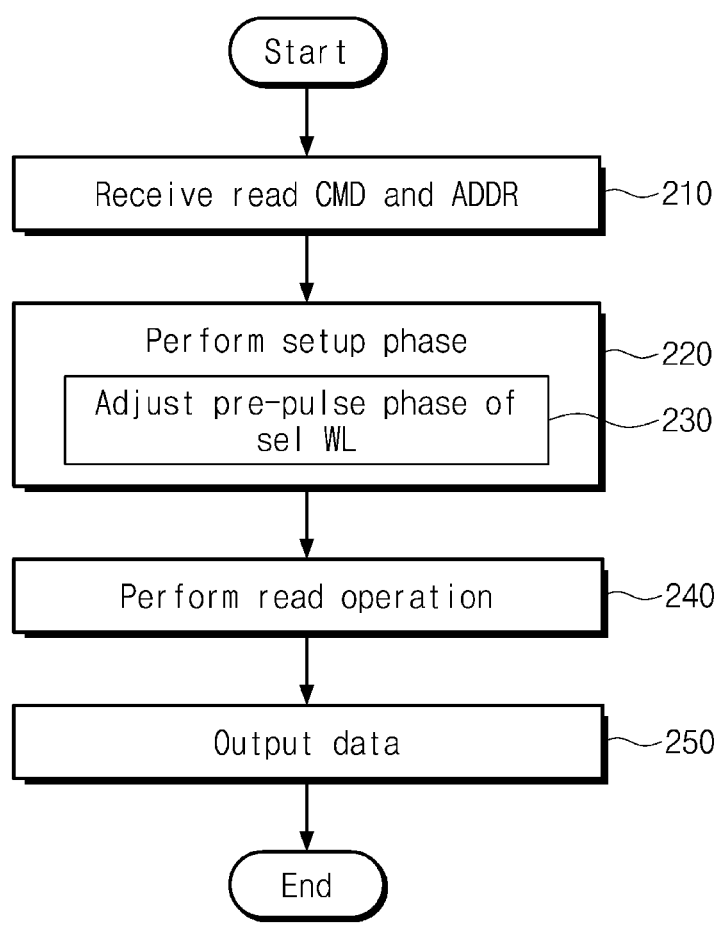
FIG. 8 is a flowchart illustrating a read operation of a nonvolatile memory device of FIG. 1 according to example embodiments.

FIG. 8 is a flowchart illustrating a read operation of a nonvolatile memory device of FIG. 1 according to example embodiments. Referring to FIGS. 1, 5, and 8, in operation S210, the nonvolatile memory device 100 may receive the read command CMD and the address ADDR from the memory controller. In operation S220, the nonvolatile memory device 100 may perform a setup phase in response to the read command CMD.

In operation S230, a pre-pulse phase of the selected word line sel WL may be adjusted. Unlike FIG. 3, a pre-pulse phase associated with the selected word line sel WL and a pre-pulse phase associated with the second unselected string selection line unsel SSL2 and the unselected ground selection line unsel GSL may be different. For example, the pre-pulse phase associated with the selected word line sel WL may be shorter or longer than the pre-pulse phase associated with the second unselected string selection line unsel SSL2 and the unselected ground selection line unsel GSL.

In an embodiment, the pre-pulse phase associated with the selected word line sel WL may be determined depending on a read voltage level (e.g., VRD), regardless of the pre-pulse phase associated with the unselected selection lines unsel SSL and unsel GSL. As the read voltage level increases, a pre-pulse phase may decrease. Alternatively, as the read voltage level increases, the pre-pulse voltage may decrease. This will be more fully described with reference to the following drawings.

In operation S240, the nonvolatile memory device 100 may perform a read operation. In operation S250, the nonvolatile memory device 100 may output read data. Operation S210, operation S220, operation S240, and operation S250 are described with reference to FIG. 5, and thus, additional description will be omitted to avoid redundancy.

Figure 9:
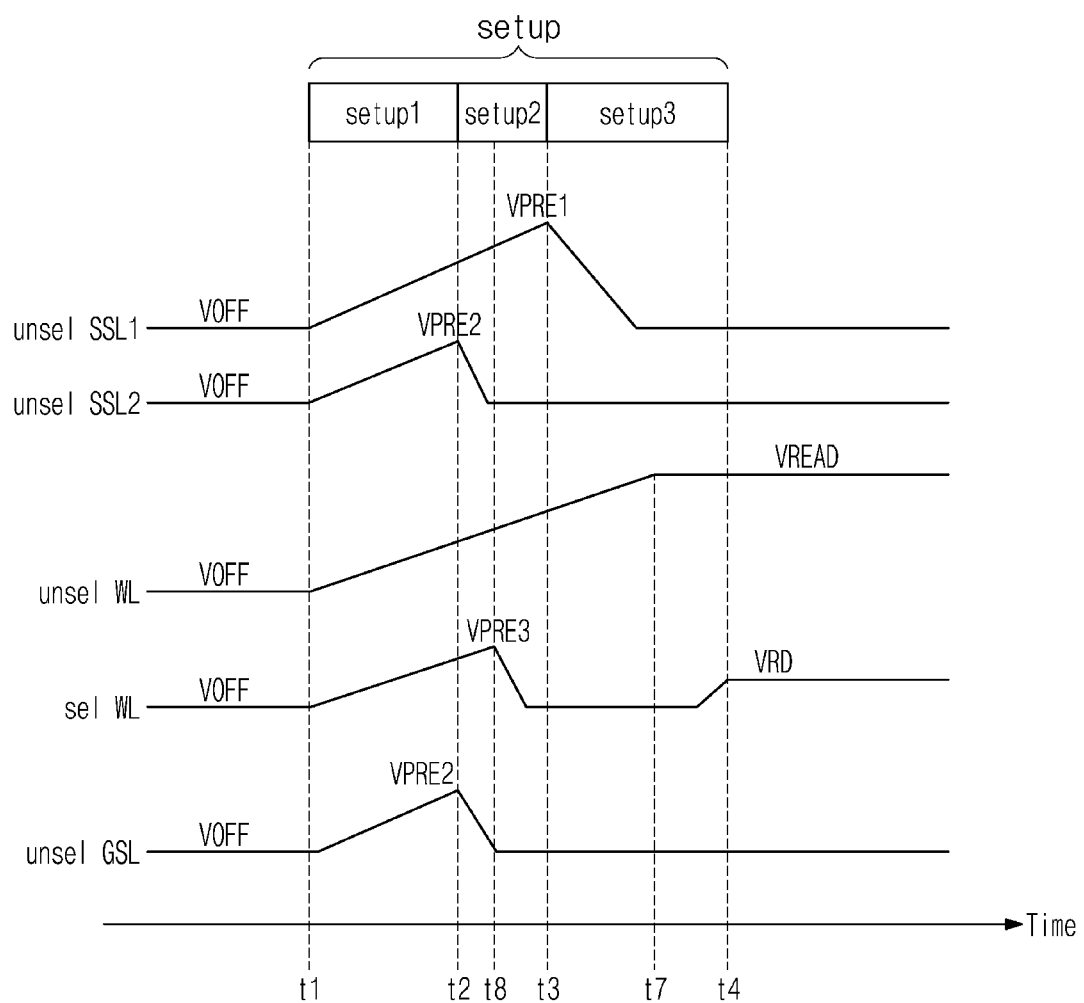
FIG. 9 illustrates an example of voltages applied to a memory block of FIG. 2 during a setup phase of FIG. 3 according to example embodiments.

FIG. 9 illustrates an example of voltages applied to the memory block BLKa of FIG. 2 during a setup phase of FIG. 3 according to example embodiments. Referring to FIGS. 1, 2, and 9, a voltage that is applied to the selected word line sel WL may increase from the off voltage VOFF to a third pre-pulse voltage VPRE3 from the first time point t1 to an eighth time point t8. Afterwards, the voltage that is applied to the selected word line sel WL may decrease from the third pre-pulse voltage VPRE3 to the off voltage VOFF. Afterwards, the voltage that is applied to the selected word line sel WL may increase from the off voltage VOFF to the read voltage VRD. At the fourth time point t4, the voltage that is applied to the selected word line sel WL may reach a level of the read voltage VRD.

Compared to FIG. 3, a pre-pulse phase of the second unselected string selection line unsel SSL2, the selected word line sel WL, and the unselected ground selection line unsel GSL may be from the first time point t1 to the second time point t2. For example, in FIG. 3, the pre-pulse phase of the selected word line sel WL may be different from the pre-pulse phase of the first unselected string selection line unsel SSL1 and may be the same as the pre-pulse phase of the second unselected string selection line unsel SSL2 and the unselected ground selection line unsel GSL. For this reason, a time taken for a voltage of the unselected word line unsel WL to reach a level of the read pass voltage VREAD may increase. Thus, a read time may increase, and read performance of a storage device may decrease.

In contrast, in FIG. 9, the pre-pulse phase of the second unselected string selection line unsel SSL2 and the unselected ground selection line unsel GSL may be from the first time point t1 to the second time point t2, and the pre-pulse phase of the selected word line sel WL may be from the first time point t1 to the eighth time point t8. The pre-pulse phase of the selected word line sel WL and the pre-pulse phase of the second unselected string selection line unsel SSL2 and the unselected ground selection line unsel GSL may be different from each other. As such, a time taken for a voltage of the unselected word line unsel WL to reach a target level may decrease. For example, a level of the read pass voltage VREAD may be reached at a seventh time point t7 preceding the fourth time point t4.

An example where the pre-pulse phase of the selected word line sel WL is longer than the pre-pulse phase of the second unselected string selection line unsel SSL2 and the unselected ground selection line unsel GSL is illustrated in FIG. 9. However, the pre-pulse phase of the selected word line sel WL may be shorter than the pre-pulse phase of the second unselected string selection line unsel SSL2 and the unselected ground selection line unsel GSL. For example, a voltage that is applied to the selected word line sel WL may increase from the off voltage VOFF to the third pre-pulse voltage VPRE3 from the first time point t1 to a time point preceding the second time point t2 (e.g., a time point t8 of FIG. 16). For example, a time period during which a pre-pulse voltage is applied to the selected word line sel WL may be shorter than a time period during which a pre-pulse voltage is applied to the second unselected string selection line unsel SSL2 and the unselected ground selection line unsel GSL.

The first to third pre-pulse voltages VPRE1 to VPRE3 may turn on the string selection transistor SST and the ground selection transistors GST. The first to third pre-pulse voltages VPRE1 to VPRE3 may be smaller than the read pass voltage VREAD. Levels of the first to third pre-pulse voltages VPRE1 to VPRE3 may change depending on a location where the first to third pre-pulse voltages VPRE1 to VPRE3 are applied and a kind of each of the first to third pre-pulse voltages VPRE1 to VPRE3. The level of the first pre-pulse voltage VPRE1 may be higher than the level of the second and third pre-pulse voltage VPRE2 and VPRE3. The level of the second pre-pulse voltage VPRE2 may be the same as the level of the third pre-pulse voltage VPRE3. However, the present disclosure is not limited thereto, each level of the first to third pre-pulse voltages VPRE1 to VPRE3 may vary depending on the implementation.

Figure 10:
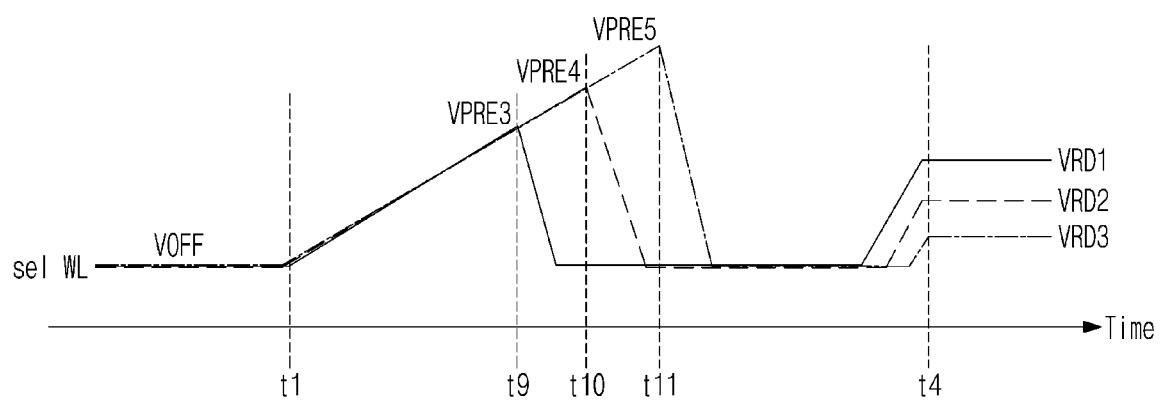
FIG. 10 illustrates an example of a voltage applied to a selected word line during a setup phase of FIG. 3 according to example embodiments.

FIG. 10 illustrates an example of a voltage applied to a selected word line during a setup phase of FIG. 3 according to example embodiments. An embodiment where a pre-pulse phase of the selected word line sel WL varies depending on a level of the read voltage VRD is illustrated in FIG. 10. For convenience of description and for brevity of drawing, the first to third read voltages VRD1 to VRD3 are illustrated. However, the present disclosure is not limited thereto. For example, the number of read voltages may be changed.

A solid line indicates a voltage that is applied to the selected word line sel WL during the setup phase "setup", in the case where the first read voltage VRD1 is applied thereto during the sensing phase "sensing". A dashed line indicates a voltage that is applied to the selected word line sel WL during the setup phase "setup", in the case where the second read voltage VRD2 is applied thereto during the sensing phase "sensing". A dash-single dotted line indicates a voltage that is applied to the selected word line sel WL during the setup phase "setup", in the case where the third read voltage VRD3 is applied thereto during the sensing phase "sensing". It is assumed that the second read voltage VRD2 is greater than the third read voltage VRD3 and the first read voltage VRD1 is greater than the second read voltage VRD2.

In the case where the first read voltage VRD1 is applied to the selected word line sel WL during the sensing phase sensing, a voltage that is applied to the selected word line sel WL may increase from the off voltage VOFF to a third pre-pulse voltage VPRE3 from the first time point t1 to a ninth time point t9. Next, the voltage that is applied to the selected word line sel WL may decrease from the third pre-pulse voltage VPRE3 to the off voltage VOFF. Then, the voltage that is applied to the selected word line sel WL may increase from the off voltage VOFF to the first read voltage VRD1. After the fourth time point t4, the voltage that is applied to the selected word line sel WL may be maintained at the first read voltage VRD1.

In the case where the second read voltage VRD2 is applied to the selected word line sel WL during the sensing phase "sensing", a voltage that is applied to the selected word line sel WL may increase from the off voltage VOFF to a fourth pre-pulse voltage VPRE4 from the first time point t1 to a tenth time point t10. Next, the voltage that is applied to the selected word line sel WL may decrease from the fourth pre-pulse voltage VPRE4 to the off voltage VOFF. Then, the voltage that is applied to the selected word line sel WL may increase from the off voltage VOFF to the second read voltage VRD2. After the fourth time point t4, the voltage that is applied to the selected word line sel WL may be maintained at the second read voltage VRD2.

In the case where the third read voltage VRD3 is applied to the selected word line sel WL during the sensing phase "sensing", a voltage that is applied to the selected word line sel WL may increase from the off voltage VOFF to a fifth pre-pulse voltage VPRE5 from the first time point t1 to an eleventh time point t11. Next, the voltage that is applied to the selected word line sel WL may decrease from the fifth pre-pulse voltage VPRE5 to the off voltage VOFF. Then, the voltage that is applied to the selected word line sel WL may increase from the off voltage VOFF to the third read voltage VRD3. After the fourth time point t4, the voltage that is applied to the selected word line sel WL may be maintained at the third read voltage VRD3.

As described above, a pre-pulse phase of the selected word line sel WL may vary depending on the read voltages VRD1 to VRD3 that are applied to the selected word line sel WL. In an embodiment, a level of a pre-pulse voltage that is applied to the selected word line sel WL may be variable. In an embodiment, a time period during which the pre-pulse voltage is applied to the selected word line sel WL may be variable. In an embodiment, a start time from which the pre-pulse voltage is applied to the selected word line sel WL may be variable. In an embodiment, a start time from which the read voltages VRD1 to VRD3 are applied to the selected word line sel WL may be variable.

In an embodiment, a level of a pre-pulse voltage that is applied to the selected word line sel WL may vary depending on levels of the read voltages VRD1 to VRD3. Levels of the pre-pulse voltages VPRE3 to VPRE5 may be different. The fourth pre-pulse voltage VPRE4 may be greater than the third pre-pulse voltage VPRE3. The fifth pre-pulse voltage VPRE5 may be greater than the fourth pre-pulse voltage VPRE4. For example, as a level of a read voltage decreases, a level of a pre-pulse voltage may increase. In other examples, as a level of a read voltage decreases, a time period during which a pre-pulse voltage is applied may decrease.

In an embodiment, a time period during which a pre-pulse voltage is applied to the selected word line sel WL may vary depending on the read voltages VRD1 to VRD3. For example, as a level of a read voltage increases, a time period during which a pre-pulse voltage is applied may decrease.

The present disclosure is not limited to a description of FIG. 10. For example, a time period during which a pre-pulse voltage is applied may be variable, while the pre-pulse voltages VPRE3 to VPRE5 may have the same voltage level. Alternatively, a start time at which a pre-pulse voltage is applied to the selected word line sel WL may vary depending on the read voltages VRD1 to VRD3. For example, as a level of a read voltage increases, the start time at which a pre-pulse voltage is applied may become advanced.

As described above, a pre-pulse phase associated with the selected word line sel WL may vary depending on read voltage levels. Levels of pre-pulse voltages, a time period during which a pre-pulse voltage is applied, a start time at which a pre-pulse voltage is applied, or a combination thereof may be variable. The present disclosure is not limited thereto. For example, as well as the above conditions, various conditions of a pre-pulse phase, such as a slope, may be variable.

Figure 11:
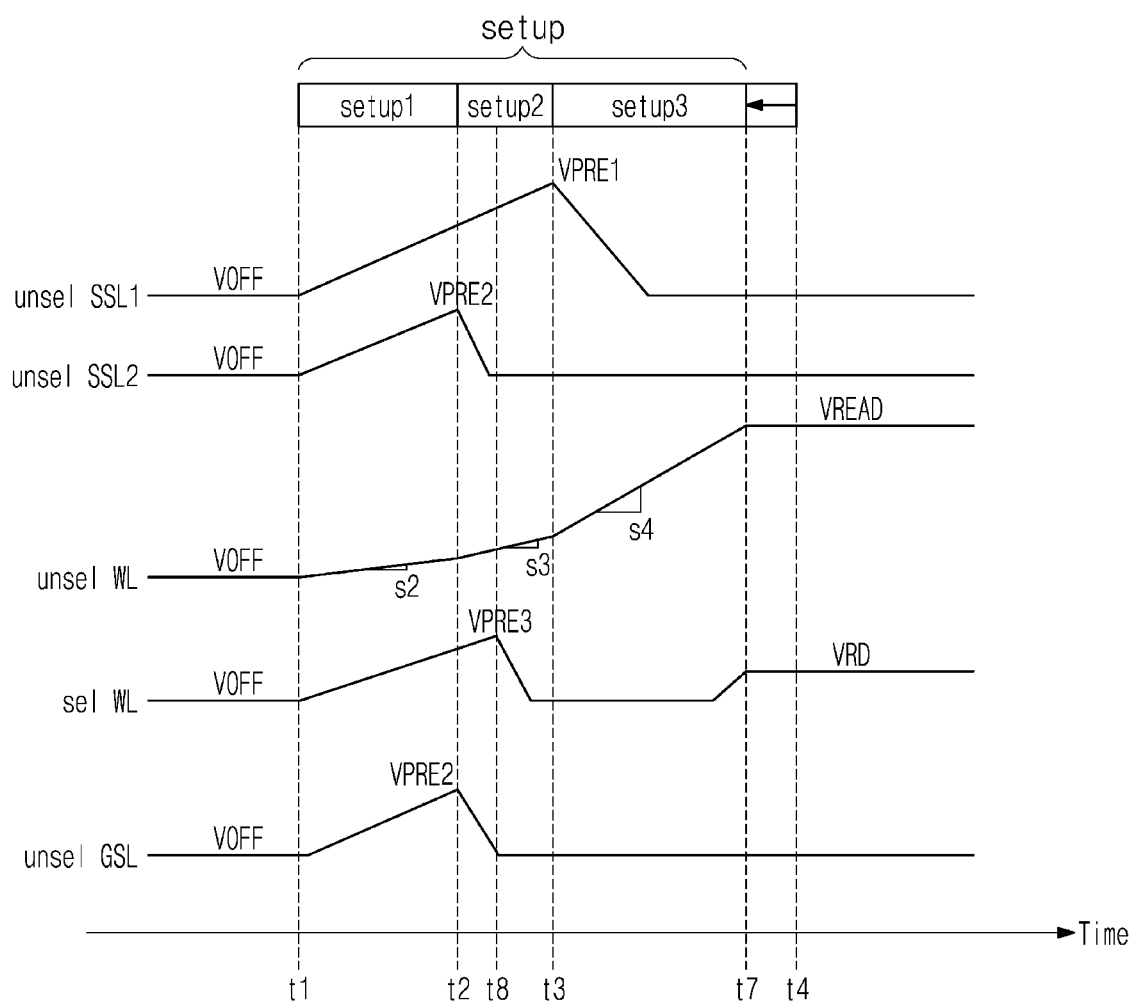
FIG. 11 illustrates an example of voltages applied to a memory block of FIG. 2 during a setup phase of FIG. 3 according to example embodiments.

FIG. 11 illustrates an example of voltages applied to the memory block BLKa of FIG. 2 during a setup phase of FIG. 3 according to example embodiments. An example where a voltage applied to the unselected word line unsel WL increases at different slopes in respective phases and the pre-pulse phase of the selected word line sel WL is different from the pre-pulse phase of the second unselected string selection line unsel SSL2 and the unselected ground selection line unsel GSL is illustrated in FIG. 11.

Compared to FIG. 3, the voltage applied to the unselected word line unsel WL may increase at the second slope s2 from the first time point t1 to the second time point t2, may increase at the third slope s3 from the second time point t2 to the third time point t3, and may increase at the fourth slope s4 from the third time point t3 to the seventh time point t7. The voltage applied to the unselected word line unsel WL may reach a level of the read pass voltage VREAD at the seventh time point t7 preceding the fourth time point t4.

The pre-pulse phase of the selected word line sel WL may be from the first time point t1 to the eighth time point t8. The pre-pulse phase of the second unselected string selection line unsel SSL2 and the unselected ground selection line unsel GSL may be from the first time point t1 to the second time point t2. For example, the pre-pulse phase of the selected word line sel WL and the pre-pulse phase of the second unselected string selection line unsel SSL2 and the unselected ground selection line unsel GSL may be different from each other.

According to the above description, a setup time may be shortened by adjusting a slope of a voltage applied to the unselected word line unsel WL and making the pre-pulse phase of the selected word line sel WL different from the pre-pulse phase of the second unselected string selection line unsel SSL2 and the unselected ground selection line unsel GSL.

Figure 12:
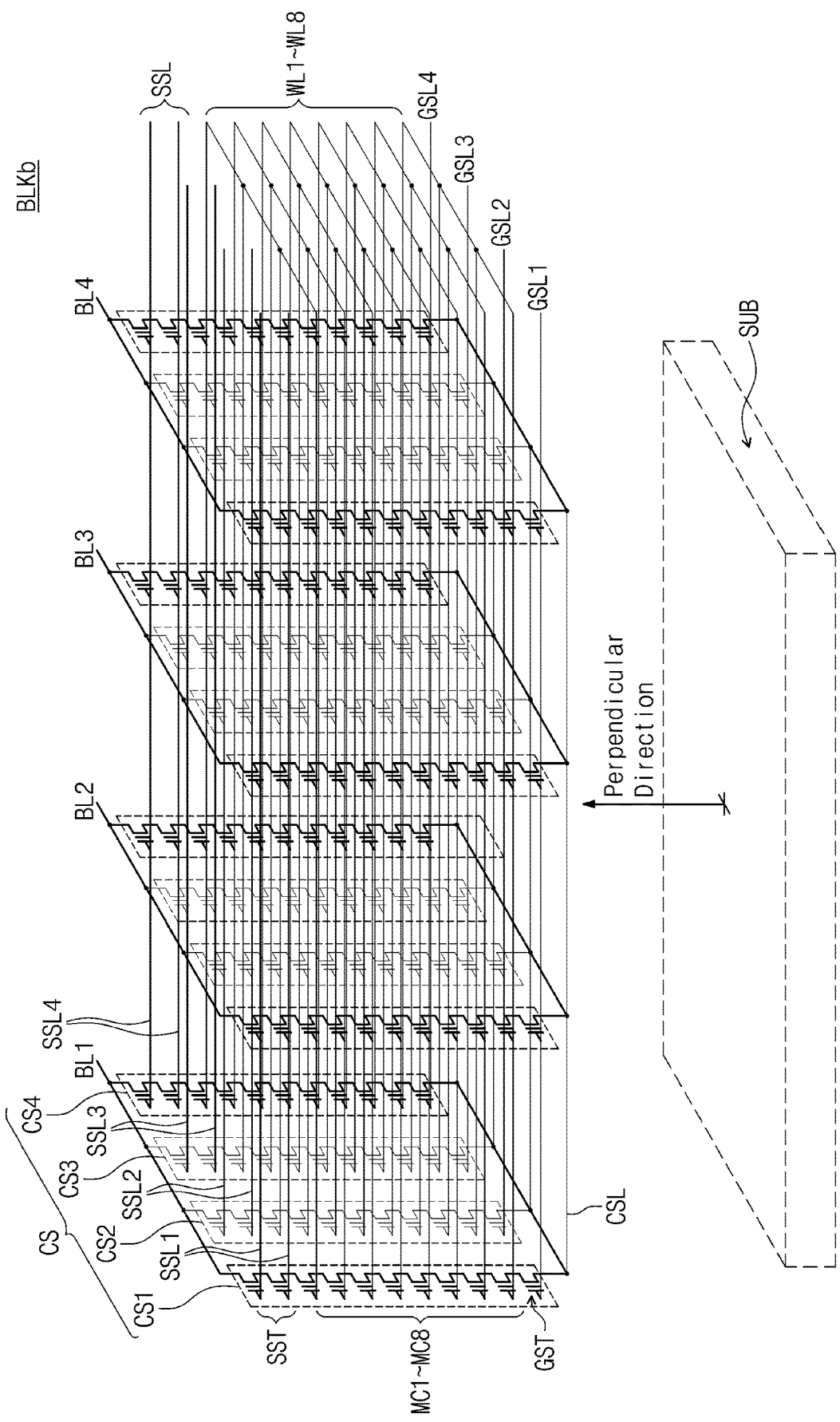
FIG. 12 is a circuit diagram illustrating another example of one memory block of memory blocks of FIG. 1 according to example embodiments.

FIG. 12 is a circuit diagram illustrating another example of one memory block of memory blocks of FIG. 1 according to example embodiments. Compared to the memory block BLKa of FIG. 2, in a memory block BLKb of FIG. 12, rows of cell strings may be connected to different ground selection lines. For example, four rows of cell strings may be connected to first to fourth ground selection lines GSL1 to GSL4 that are different.

Like the description given with reference to FIG. 3, it is assumed that the second string selection line SSL2 and the fourth word line WL4 are selected by the address ADDR. Compared to FIG. 2, the selected ground selection line sel GSL may include the second ground selection line GSL2. The unselected ground selection lines unsel GSL may include the first, third, and fourth ground selection lines GSL1, GSL3, and GSL4.

Like the description given with reference to FIG. 2, the unselected string selection line unsel SSL may include the first, third, and fourth string selection lines SSL1, SSL3, and SSL4. However, the first unselected string selection line unsel SSL1 may not exist. For example, because a ground selection line is not shared, an unselected string selection line corresponding to a selected ground selection line sel GSL may not exist.

Figure 13:
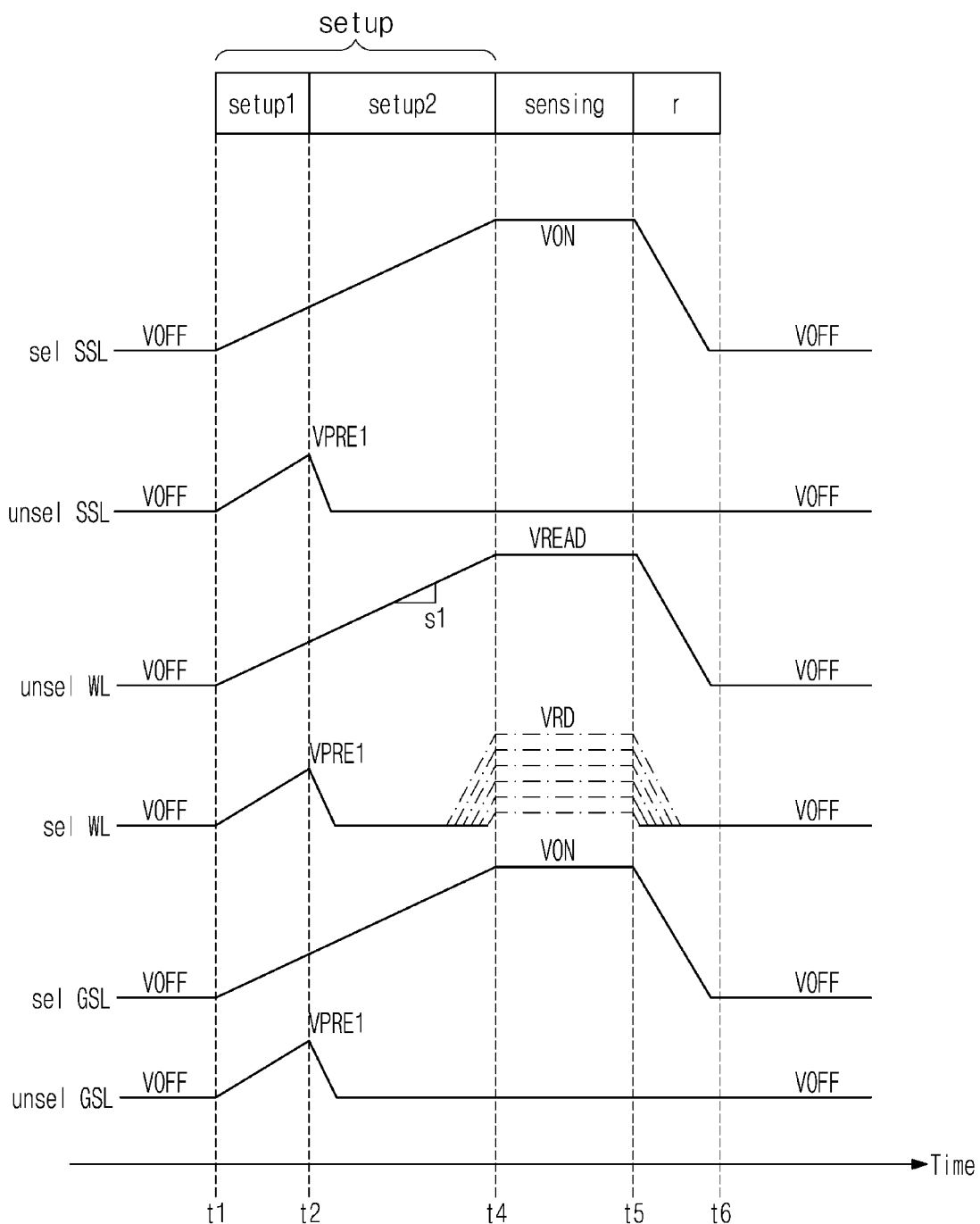
FIG. 13 illustrates an example of voltages applied to a memory block of FIG. 12 in a read operation according to example embodiments.

FIG. 13 illustrates an example of voltages applied to the memory block BLKb of FIG. 12 in a read operation according to example embodiments. Compared to FIG. 3, a voltage that is applied to the unselected string selection line unsel SSL may increase from the off voltage VOFF to a first pre-pulse voltage VPRE1 from the first time point t1 to the second time point t2. Next, the voltage that is applied to the unselected string selection line unsel SSL may decrease from the first pre-pulse voltage VPRE1 to the off voltage VOFF. Then, the voltage that is applied to the unselected ground selection line unsel GSL may be maintained at the off voltage VOFF.

Voltages that are applied to the selected word line sel WL and the unselected ground selection line unsel GSL may increase from the off voltage VOFF to the first pre-pulse voltage VPRE1 from the first time point t1 to the second time point t2. Next, the voltages that are applied to the selected word line sel WL and the unselected ground selection line unsel GSL may decrease from the first pre-pulse voltage VPRE1 to the off voltage VOFF. Then, the voltages that are applied to the unselected ground selection line unsel GSL may be maintained at the off voltage VOFF. Like FIG. 3, the read voltage VRD may be applied to the selected word line Sel WL depending on a selected cell data. This is described above, and thus, additional description will be omitted to avoid redundancy.

The setup phase "setup" may include first and second setup phases "setup1" and "setup2". The first setup phase "setup1" indicates a phase where the first pre-pulse voltage VPRE1 is applied to the unselected selection lines unsel SSL and unsel GSL and the selected word line sel WL and the read pass voltage VREAD is applied to the unselected word line unsel WL. For example, the first setup phase "setup1" may be from a first time point t1 to a second time point t2. The second setup phase "setup2" indicates a phase where the first pre-pulse voltage VPRE1 is not applied to the unselected selection lines unsel SSL and unsel GSL and the read pass voltage VREAD is applied to the unselected word line unsel WL. For example, the second setup phase "setup2" may be from the second time point t2 to a fourth time point t4.

Figure 14:
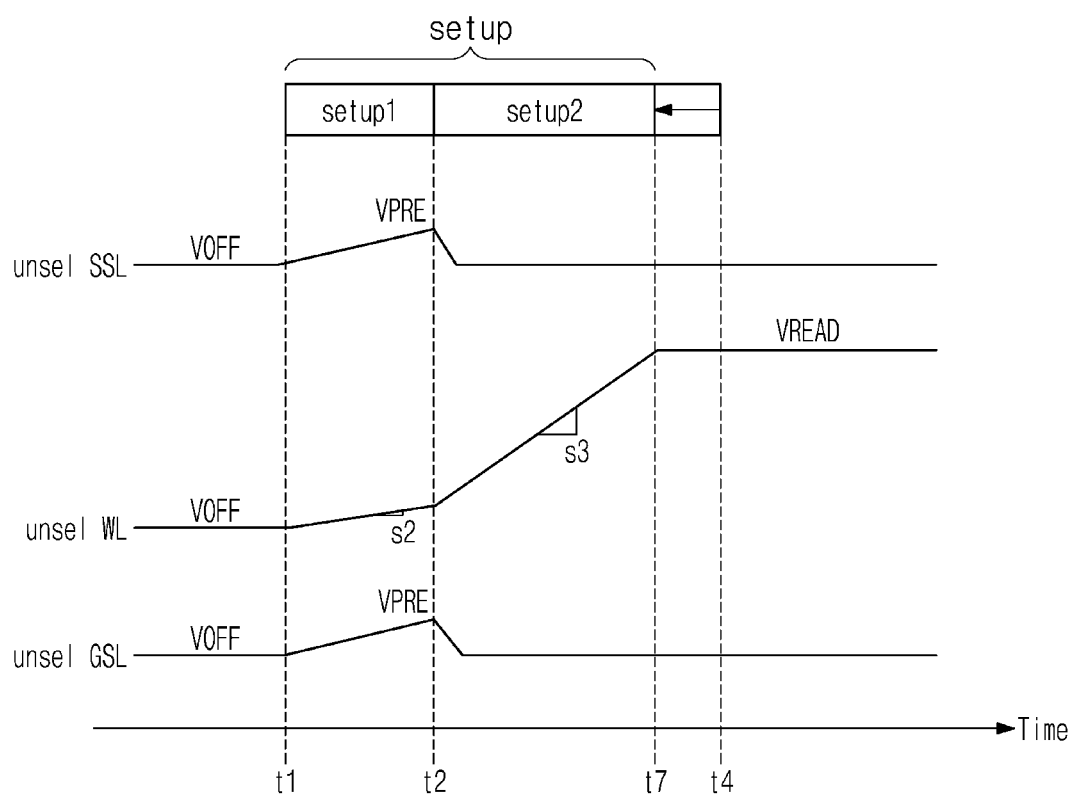
FIG. 14 illustrates an example of voltages applied to a memory block of FIG. 12 during a setup phase of FIG. 13 according to example embodiments.

FIG. 14 illustrates an example of voltages applied to the memory block BLKb of FIG. 12 during a setup phase of FIG. 13 according to example embodiments. For convenience of description and for brevity of drawing, in FIG. 14, the unselected string selection line unsel SSL, the unselected word line unsel WL, and the unselected ground selection line unsel GSL are illustrated, and the remaining lines are omitted. Referring to FIGS. 12 to 14, a slope of a voltage that is applied to the unselected word line unsel WL may change.

In an embodiment, the voltage that is applied to the unselected word line unsel WL may increase from the off voltage VOFF to the read pass voltage VREAD during the setup phase "setup". During the first setup phase "setup1", the voltage of the unselected word line unsel WL may increase at a second slope s2. During the second setup phase "setup2", the voltage of the unselected word line unsel WL may increase at a third slope s3. The second slope s2 may be smaller than the first slope s1. The third slope s3 may be greater than the first and second slopes s1 and s2.

Compared to FIG. 13, at a seventh time point t7 preceding the fourth time point t4, the voltage of the unselected word line unsel WL may reach a level of the read pass voltage VREAD. For example, a time period of the setup phase "setup" may decrease. Because the third slope s3 is greater than the first slope s1, during the second setup phase "setup2", the voltage of the unselected word line unsel WL may reach a level of the read pass voltage VREAD within a shorter time.

Figure 15:
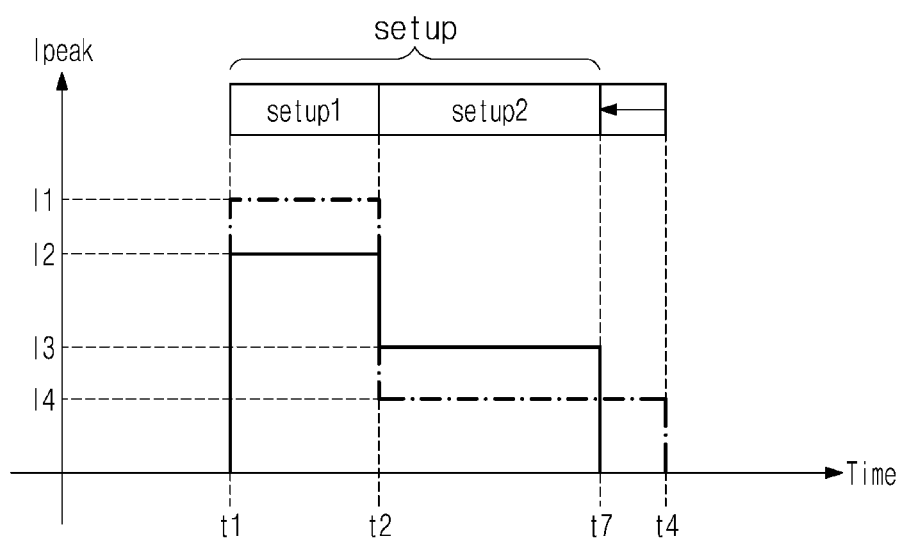
FIG. 15 is a graph illustrating a peak current over time according to example embodiments.

FIG. 15 is a graph illustrating a peak current over time according to example embodiments. The case where a peak current decreases in the first setup phase "setup1" by adjusting a rising slope of a voltage applied to the unselected word line unsel WL will be described with reference to FIG. 15. In FIG. 15, a horizontal axis represents a time, and a vertical axis represents a peak current. In the graph of FIG. 15, a dash-single dotted line indicates a peak current when a voltage applied to the unselected word line unsel WL increases at a uniform slope. In the graph of FIG. 15, a bold line indicates a peak current when a voltage applied to the unselected word line unsel WL increases at different slopes in respective phases.

While a pre-pulse voltage is applied, a peak current may increase due to parasitic capacitors of channels. In an embodiment, in the case where the voltage applied to the unselected word line unsel WL increases at a uniform slope in the setup phase "setup", a peak current in the first setup phase "setup1" may be a first current I1. A peak current in the second setup phase "setup2" may be a fourth current I4. The first current I1 may be four times the fourth current I4. However, the present disclosure is not limited thereto.

A peak current may be determined depending on the number of cell strings where upper channels and lower channels are formed. During the first setup phase "setup1", upper channels and lower channels of the first to fourth cell strings CS1 to CS4 included in a first column may be formed. During the second setup phase "setup2", the upper channel and the lower channel of the second cell string CS2 may be formed. Accordingly, the first current I1 being a peak current of the first setup phase "setup1" may be the largest, and the fourth current I4 may be the smallest.

In the case where a voltage applied to the unselected word line unsel WL increases at different slopes in respective setup phases, a peak current in the first setup phase "setup1"

may be a second current I2. A peak current in the second setup phase "setup2" may be a third current I3. Because the voltage applied to the unselected word line unsel WL of FIG. 14 increases at the second slope s2 smaller than the first slope s1 during the first setup phase "setup1", the second current I2 may be smaller than the first current I1.

Figure 16:
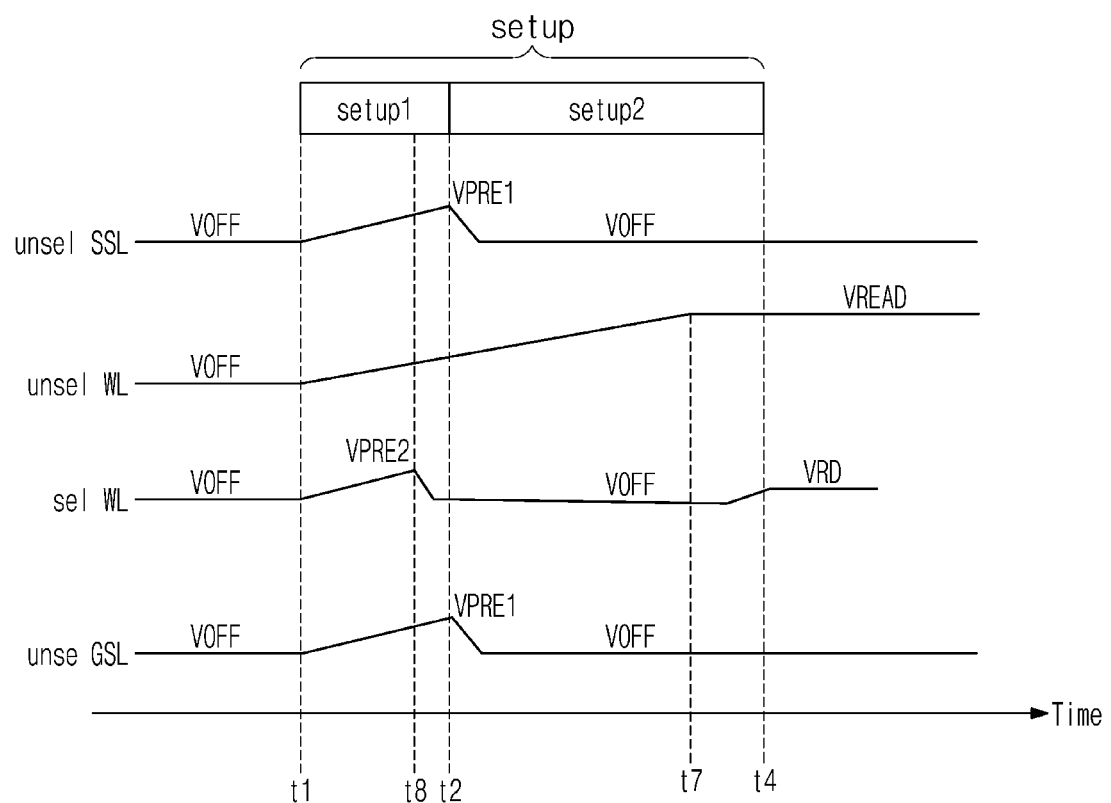
FIG. 16 illustrates an example of voltages applied to a memory block of FIG. 12 during a setup phase of FIG. 13 according to example embodiments.

FIG. 16 illustrates an example of voltages applied to the memory block BLKb of FIG. 12 during a setup phase of FIG. 13 according to example embodiments. Referring to FIGS. 12, 13, and 16, a voltage that is applied to the selected word line sel WL may increase from the off voltage VOFF to a second pre-pulse voltage VPRE2 from a first time point t1 to an eighth time point t8 preceding the second time point t2. Next, the voltage that is applied to the selected word line sel WL may decrease from the second pre-pulse voltage VPRE2 to the off voltage VOFF. Then, the voltage that is applied to the selected word line sel WL may increase from the off voltage VOFF to the read voltage VRD. At a fourth time point t4, the voltage that is applied to the selected word line sel WL may reach a level of the read voltage VRD.

In FIG. 13, a pre-pulse phase of the unselected string selection line unsel SSL, the selected word line sel WL, and the unselected ground selection line unsel GSL may be from the first time point t1 to the second time point t2. For example, the pre-pulse phase of the selected word line sel WL may be the same as the pre-pulse phase of the unselected string selection line unsel SSL and the unselected ground selection line unsel GSL. For this reason, a time taken for a voltage of the unselected word line unsel WL to reach a level of the read pass voltage VREAD may increase. Thus, a read time may increase, and read performance of a storage device may decrease.

In contrast, in FIG. 16, a pre-pulse phase of the unselected string selection line unsel SSL and the unselected ground selection line unsel GSL may be from the first time point t1 to the second time point t2, and a pre-pulse phase of the selected word line sel WL may be from the first time point t1 to the eighth time point t8. The pre-pulse phase of the selected word line sel WL and the pre-pulse phase of the unselected string selection line unsel SSL and the unselected ground selection line unsel GSL may be different. As such, a time taken for a voltage of the unselected word line unsel WL to reach a target level may decrease. For example, a level of the read pass voltage VREAD may be reached at a seventh time point t7 preceding the fourth time point t4.

Compared to FIG. 13, at a seventh time point t7 preceding the fourth time point t4, the voltage of the unselected word line unsel WL may reach a level of the read pass voltage VREAD. For example, a time period of the setup phase "setup" may decrease. Because the pre-pulse phase of the selected word line sel WL may be from the first time point t1 to the eighth time point t8 preceding the second time point t2.

An example where the pre-pulse phase of the selected word line sel WL is shorter than the pre-pulse phase of the unselected string selection line unsel SSL and the unselected ground selection line unsel GSL is illustrated in FIG. 16. However, the pre-pulse phase of the selected word line sel WL may be longer than the pre-pulse phase of the unselected string selection line unsel SSL and the unselected ground selection line unsel GSL. For example, a voltage that is applied to the selected word line sel WL may increase from the off voltage VOFF to the pre-pulse voltage VPRE from the first time point t1 to a time point following the second time point t2. For example, a time period during which a pre-pulse voltage is applied to the selected word line sel WL may be longer than a time period during which a pre-pulse voltage is applied to the unselected string selection line unsel SSL and the unselected ground selection line unsel GSL.

Figure 17:
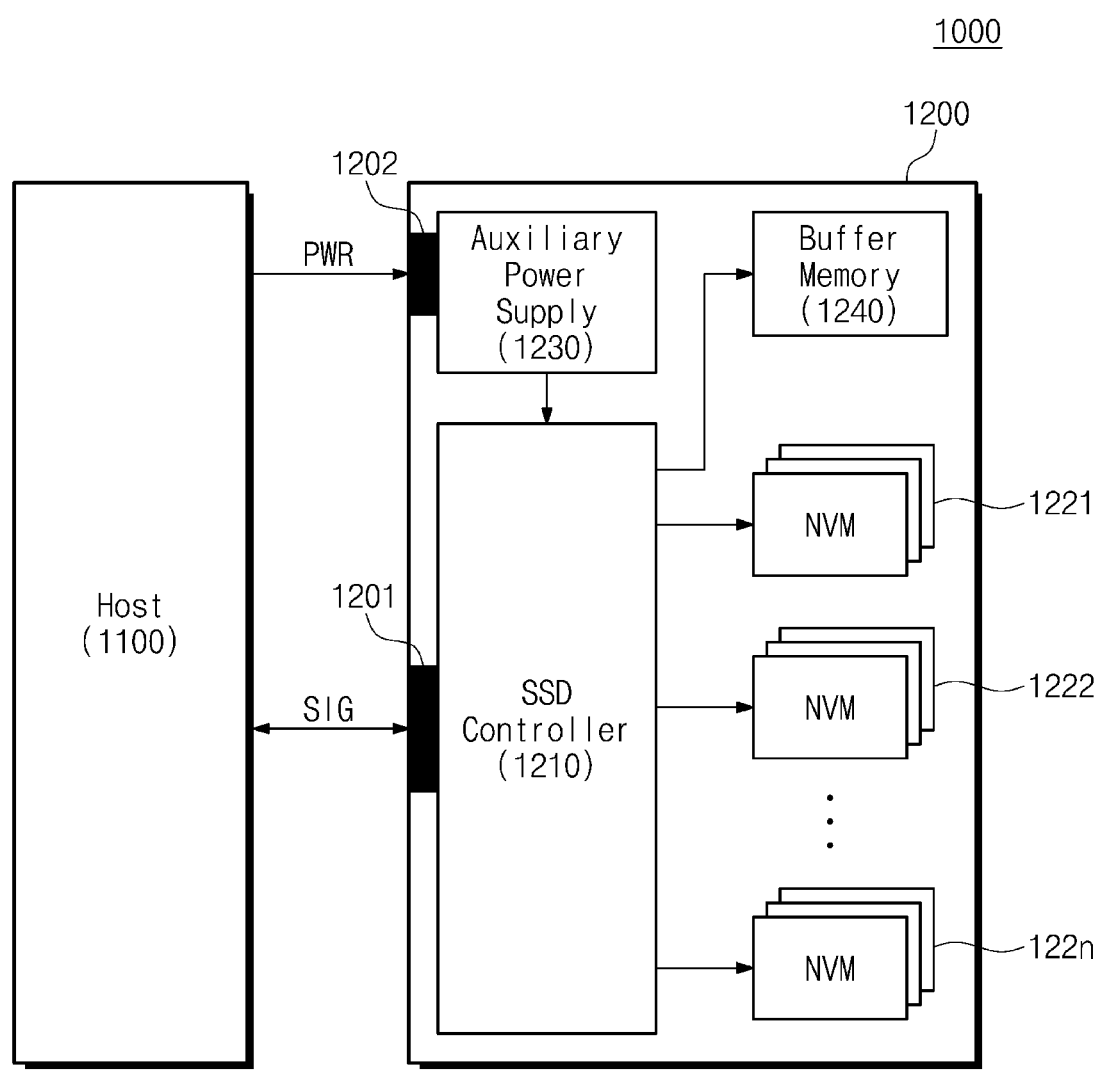
FIG. 17 is a block diagram illustrating a solid state drive system to which a storage system according to an embodiment of the present disclosure is applied.

FIG. 17 is a block diagram illustrating a solid state drive system to which a storage system according to an embodiment of the present disclosure is applied. Referring to FIG. 17, a solid state drive (SSD) system 1000 may include a host 1100 and an SSD 1200.

The SSD 1200 exchanges signals SIG with the host 1100 through a signal connector 1201 and is supplied with a power PWR through a power connector 1202. In an embodiment, the signal connector 1201 may include a PCIe port, the signals SIG may be signals defined in the NVMe protocol, and the SSD 1200 may include an NVMe-based storage device. The SSD 1200 includes an SSD controller 1210, a plurality of flash memories 1221 to 122n, an auxiliary power supply 1230, and a buffer memory 1240. In an embodiment, each of the plurality of flash memories 1221 to 122n may be implemented with a separate die, a separate chip, or a separate package.

The SSD controller 1210 may control the plurality of flash memories 1221 to 122n in response to the signals SIG received from the host 1100. The plurality of flash memories 1221 to 122n may operate under control of the SSD controller 1210. In an embodiment, the plurality of flash memories 1221 to 122n may operate based on the operation method described with reference to FIGS. 1 to 16. The auxiliary power supply 1230 is connected to the host 1100 through the power connector 1202. The auxiliary power supply 1230 may be charged by the power PWR supplied from the host 1100. When the power PWR is not smoothly supplied from the host 1100, the auxiliary power supply 1230 may power the SSD 1200.

Figure 18:
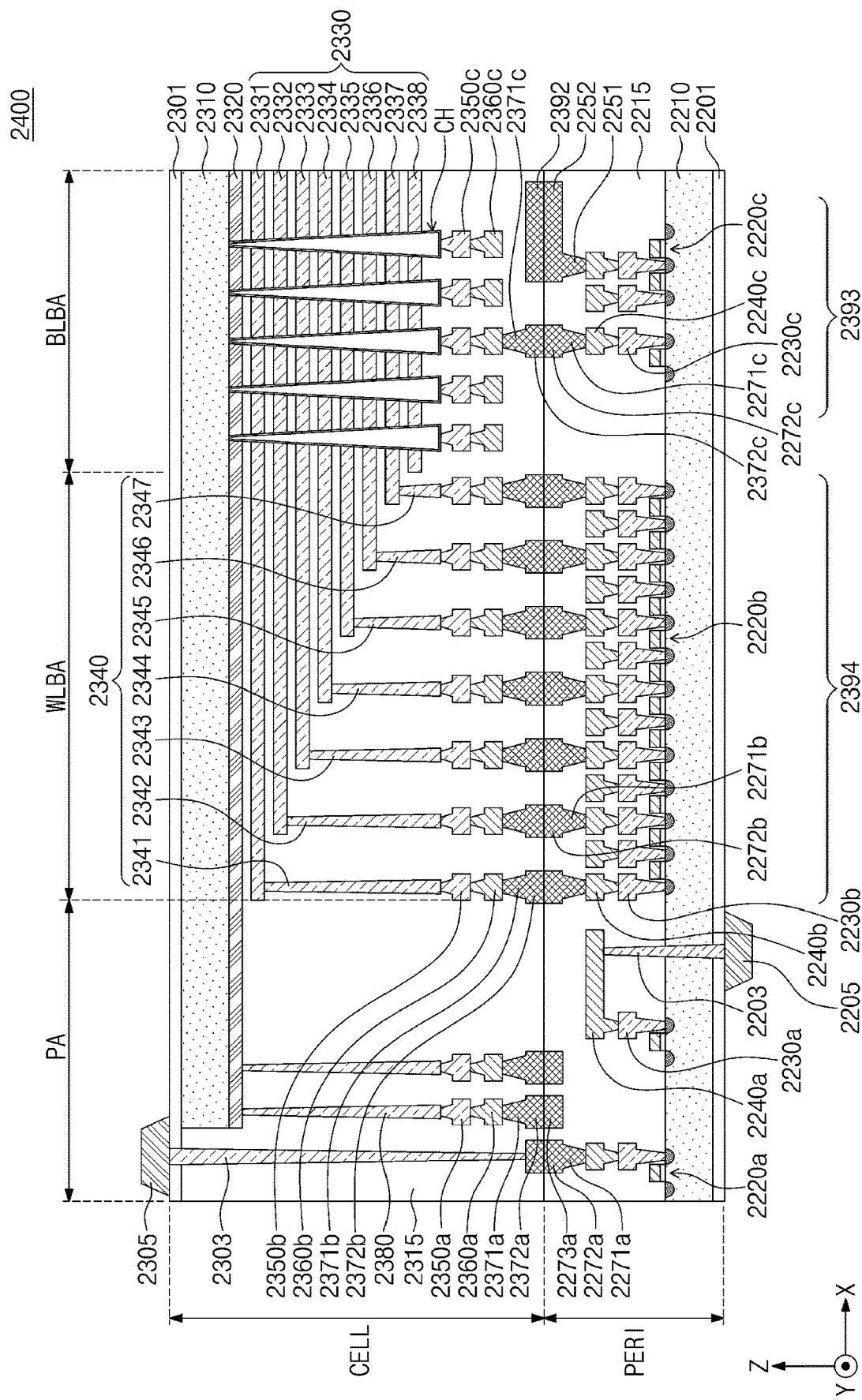
FIG. 18 is a cross-sectional view illustrating a nonvolatile memory device according to an embodiment of the present disclosure.

FIG. 18 is a cross-sectional view illustrating a nonvolatile memory device according to an embodiment of the present disclosure. Referring to FIG. 18, a nonvolatile memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a manner of electrically connecting a bonding metal formed on an uppermost metal layer of the upper chip and a bonding metal formed on an uppermost metal layer of the lower chip. For example, in the case where the bonding metal is formed of copper (Cu), the bonding manner may be a Cu-to-Cu bonding manner. Alternatively, the bonding metal may be formed of aluminum (Al) or tungsten (W).

Each of the peripheral circuit region PERI and the cell region CELL of the nonvolatile memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected with the plurality of circuit elements 2220a, 2220b, and 2220c, and second metal layers 2240a, 2240b, and 2240c formed on the first metal layers 2230a, 2230b, and 2230c. Each of the circuit elements 2220a, 2220b, and 2220c may include one or more transistors. In an embodiment, the first metal layers 2230a, 2230b, and 2230c may be formed of tungsten having a relatively high resistance, and the second metal layers 2240a, 2240b, and 2240c may be formed of copper having a relatively low resistance.

In the specification, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a lower resistance than that of copper forming the second metal layers 2240a, 2240b, and 2240c.

The interlayer insulating layer 2215 may be disposed on the first substrate 2210 to cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected with upper bonding metals 2371b and 2372b of the cell region CELL by Cu—Cu bonding. The lower bonding metals 2271b and 2272b and the upper bonding metals 2371b and 2372b may be formed o aluminum, copper, or tungsten.

Also, the upper bonding metals 2371b and 2372b in the cell region CELL may be referred as "first metal pads", and the lower bonding metals 2271b and 2272b in the peripheral circuit region PERI may be referred as "second metal pads".

The cell region CELL may include at least one memory block. The cell region CELL may include a second substrate 2310, an interlayer insulating layer 2315, and a common source line 2320. On the second substrate 2310, a plurality of word lines 2331 to 2338 (i.e., 2330) may be stacked in a direction (i.e., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection lines.

Widths of the plurality of word lines 2330 in the X-axis direction may be different. As a distance from the first substrate 2210 of the peripheral circuit region PERI increases, the widths of the plurality of word lines 2330 gradually increase. Likewise, as a distance from the second substrate 2310 of the cell region CELL increases, the widths of the plurality of word lines 2330 gradually decrease.

In the bit line bonding area BLBA, a channel structure CH may extend in a direction perpendicular to the upper surface of the second substrate 2310 and may pass through the plurality of word lines 2330, the string selection lines, and the ground selection line. The channel structure CH may include a data storage layer, a channel layer, a buried insulating layer, and the like, and the channel layer may be electrically connected with a first metal layer 2350c and a second metal layer 2360c. For example, the first metal layer 2350c may be a bit line contact, and the second metal layer 2360c may be a bit line. In an embodiment, the bit line 2360c may extend in a first direction (i.e., a Y-axis direction) parallel to the upper surface of the second substrate 2310.

The interlayer insulating layer 2315 may be disposed on the second substrate 2310 to cover the common source line 2320, the plurality of word lines 2330, a plurality of cell contact plugs 2340, first metal layers 2350a, 2350b, and 2350c, and second metal layers 2360a, 2360b, and 2360c. The interlayer insulating layer 2315 may include an insulating material such as silicon oxide, silicon nitride, or the like.

In an embodiment illustrated in FIG. 18, an area in which the channel structure CH, the bit line 2360c, and the like are disposed may be defined as the bit line bonding area BLBA. In the bit line bonding area BLBA, the bit line 2360c may be electrically connected with the circuit elements 2220c constituting a page buffer 2393 in the peripheral circuit region PERI. For example, the bit line 2360c may be connected with upper bonding metals 2371c and 2372c in the cell region CELL, and the upper bonding metals 2371c and 2372c may be connected with lower bonding metals 2271c and 2272c connected with the circuit elements 2220c of the page buffer 2393.

In the word line bonding area WLBA, the plurality of word lines 2330 may extend in a second direction (i.e., an X-axis direction), which is perpendicular to the first direction and parallel to the upper surface of the second substrate 2310, and may be connected with a plurality of cell contact plugs 2341 to 2347 (i.e., 2340). The word lines 2330 and the cell contact plugs 2340 may be connected with each other at pads provided by at least some of the plurality of word lines 2330, which extend in the second direction with different lengths. The first metal layer 2350b and the second metal layer 2360b may be sequentially connected with an upper portion of each of the cell contact plugs 2340 connected with the word lines 2330. The cell contact plugs 2340 may be connected with the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected with the circuit elements 2220b constituting a row decoder 2394 in the peripheral circuit region PERI. In an embodiment, operating voltages of the circuit elements 2220b constituting the row decoder 2394 may be different than operating voltages of the circuit elements 2220c constituting the page buffer 2393. For example, operating voltages of the circuit elements 2220c constituting the page buffer 2393 may be greater than operating voltages of the circuit elements 2220b constituting the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected with the common source line 2320. The first metal layer 2350a and the second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

According to embodiments, input/output pads 2205 and 2305 may be disposed in the external pad bonding area PA. Referring to FIG. 18, a lower insulating film 2201 covering a lower surface of the first substrate 2210 may be formed below the first substrate 2210, and the first input/output pad 2205 may be formed on the lower insulating film 2201. The first input/output pad 2205 may be connected with at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 18, an upper insulating film 2301 covering the upper surface of the second substrate 2310 may be formed on the second substrate 2310, and the second input/output pad 2305 may be disposed on the upper insulating film 2301. The second input/output pad 2305 may be connected with at least one of the plurality of circuit elements 2220a, 2220b, and 2220c disposed in the peripheral circuit region PERI through a second input/output contact plug 2303 and lower bonding metals 2271a and 2272a of the peripheral circuit region PERI. In an embodiment, the second input/output pad 2305 may be electrically connected with the circuit element 2220a.

According to embodiments, the second substrate 2310 and the common source line 2320 may not be disposed in an area in which the second input/output contact plug 2303 is disposed. Also, the second input/output pad 2305 may not overlap the word lines 2330 in the third direction (i.e., the Z-axis direction). Referring to FIG. 18, the second input/output contact plug 2303 may be separated from the second substrate 2310 in a direction parallel to the upper surface of the second substrate 2310, may pass through the interlayer insulating layer 2315 of the cell region CELL, and may be connected with the second input/output pad 2305.

According to embodiments, the first input/output pad 2205 and the second input/output pad 2305 may be selectively formed. For example, the nonvolatile memory device 2400 may include only the first input/output pad 2205 disposed on the first substrate 2210 or the second input/output pad 2305 disposed on the second substrate 2310. Alternatively, the nonvolatile memory device 2400 may include both the first input/output pad 2205 and the second input/output pad 2305.

In each of the external pad bonding area PA and the bit line bonding area BLBA respectively included in the cell region CELL and the peripheral circuit region PERI, a metal pattern in the uppermost metal layer may be provided as a dummy pattern, or the uppermost metal layer may be absent.

In the external pad bonding area PA, the nonvolatile memory device 2400 may include a lower metal pattern 2273a in the uppermost metal layer of the peripheral circuit region PERI, and the lower metal pattern 2273a may correspond to an upper metal pattern 2372a formed in the uppermost metal layer of the cell region CELL and may have the same shape as the upper metal pattern 2372a of the cell region CELL. In the peripheral circuit region PERI, the lower metal pattern 2273a formed in the uppermost metal layer of the peripheral circuit region PERI may not be connected with a contact. As in the above description, in the external pad bonding area PA, an upper metal pattern that corresponds to the lower metal pattern 2273a formed in the uppermost metal layer of the peripheral circuit region PERI and has the same shape as the lower metal pattern 2273a of the peripheral circuit region PERI may be formed in the uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected with the upper bonding metals 2371b and 2372b of the cell region CELL by the bonding manner.

Also, in the bit line bonding area BLBA, an upper metal pattern 2392 that corresponds to a lower metal pattern 2252 formed in the uppermost metal layer of the peripheral circuit region PERI and has the same shape as the lower metal pattern 2252 of the peripheral circuit region PERI may be formed in the uppermost metal layer of the cell region CELL. A contact may not be formed on the upper metal pattern 2392 formed in the uppermost metal layer of the cell region CELL.

In an embodiment, the nonvolatile memory device 2400 may correspond to the nonvolatile memory device 100 described with reference to FIG. 1. In an embodiment, a memory cell array or a memory block described with reference to FIGS. 1, 2, 4, and 12 may be included in the cell region CELL. Peripheral circuits (e.g., an address decoder, a page buffer circuit, an input/output circuit, and a control logic circuit) described with reference to FIGS. 1 2, 4, and 12 may be included in the peripheral circuit region PERI.

As described above, the address decoder, the voltage generator, and the voltage ramper may be included in the peripheral circuit region PERI and may perform the read operation described with reference to FIGS. 1 to 16. For example, a slope of a voltage that is applied to an unselected word line of a memory block included in the cell region CELL may be adjusted. A pre-pulse phase associated with the selected word line of the memory block included in the cell region CELL may be different from a pre-pulse phase of a plurality of selection lines of the memory block included in the cell region CELL. For example, a nonvolatile memory device with improved performance is provided.

According to the present disclosure, in a read operation, a slope of a voltage applied to an unselected word line varies, and a pre-pulse phase of a selected word line and a pre-pulse phase of unselected selection lines are different. Accordingly, an operation method of a nonvolatile memory device which secures reliability and reduces a peak current while improving an operating speed is provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method comprising:

receiving a read command and an address from an external device;

increasing a voltage applied to an unselected word line from an off voltage to a read pass voltage during a setup phase in response to the read command;

increasing a voltage applied to an unselected string selection line from the off voltage to a pre-pulse voltage during a first setup phase of the setup phase;

increasing a voltage applied to an unselected ground selection line from the off voltage to the pre-pulse voltage during the first setup phase;

applying a read voltage to a selected word line to read data corresponding to the address, during a sensing phase following the setup phase; and outputting the read data through data lines after the sensing phase, wherein, during the setup phase, a slope of the voltage applied to the unselected word line is varied.

2. The method of claim 1, wherein the unselected string selection line includes a first unselected string section line and a second unselected string selection line,
wherein the first unselected string selection line corresponds to a selected ground selection line, and
wherein the second unselected string selection line corresponds the unselected ground selection line.

3. The method of claim 2, wherein the increasing of the voltage applied to the unselected string selection line from the off voltage to the pre-pulse voltage during the setup phase includes:
increasing a voltage applied to the second unselected string selection line from the off voltage to a second pre-pulse voltage during the first setup phase; and
increasing a voltage applied to the first unselected string selection line from the off voltage to a first pre-pulse voltage different from the second pre-pulse voltage during the first setup phase and a second setup phase of the setup phase following the first setup phase.

4. The method of claim 3, wherein the increasing the voltage applied to the unselected word line from the off voltage to the read pass voltage during the setup phase includes:
increasing the voltage applied to the unselected word line at a first slope during the first setup phase;
increasing the voltage applied to the unselected word line at a second slope different from the first slope during the second setup phase; and
increasing the voltage applied to the unselected word line at a third slope different from the first and second slopes during a third setup phase of the setup phase following the second setup phase,
wherein the second slope is greater than the first slope and the third slope is greater than the second slope.

5. The method of claim 3, further comprising:
increasing a voltage applied to the selected word line from the off voltage to the second pre-pulse voltage during a pre-pulse phase different from the first setup phase of the setup phase; and
decreasing the voltage applied to the selected word line to the off voltage after the pre-pulse phase.

6. The method of claim 5, wherein, as a level of the read voltage increases, the pre-pulse phase decreases.

7. The method of claim 3, further comprising:
decreasing the voltage applied to the second unselected string selection line to the off voltage and decreasing the voltage applied to the unselected ground selection line to the off voltage, after the first setup phase; and
decreasing the voltage applied to the first unselected string selection line to the off voltage after the second setup phase.

8. The method of claim 1, further comprising:
increasing a voltage applied to a selected string selection line from the off voltage to an on voltage during the setup phase; and
increasing a voltage applied to a selected ground selection line from the off voltage to the on voltage during the setup phase.

9. The method of claim 8, further comprising:
maintaining the voltages applied to the selected string selection line and the selected ground selection line at the on voltage during the sensing phase; and
maintaining the voltage applied to the unselected word line at the read pass voltage during the sensing phase.

10. The method of claim 9, further comprising:
decreasing the voltages applied to the selected string selection line and the selected ground selection line from the on voltage to the off voltage during a recovery phase following the sensing phase;
decreasing the voltage applied to the unselected word line from the read pass voltage to the off voltage during the recovery phase; and
decreasing the read voltage applied to the selected word line to the off voltage during the recovery phase.

11. An operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method comprising:
receiving a read command and an address from an external device;
increasing a voltage applied to an unselected word line from an off voltage to a read pass voltage during a setup phase in response to the read command;
increasing a voltage applied to an unselected string selection line from the off voltage to a first pre-pulse voltage during a first time period of the setup phase;
increasing a voltage applied to an unselected ground selection line from the off voltage to the first pre-pulse voltage during the first time period;
increasing a voltage applied to a selected word line from the off voltage to a second pre-pulse voltage different from the first pre-pulse voltage during a second time period of the setup phase, which is different from the first time period;
applying a read voltage to the selected word line to read data corresponding to the address, during a sensing phase following the setup phase; and
outputting the read data through data lines after the sensing phase.

12. The method of claim 11, wherein the unselected string selection line is a second unselected string selection line corresponding to the unselected ground selection line, the method further comprising:
increasing a voltage applied to a first unselected string selection line corresponding to a selected ground selection line from the off voltage to a third pre-pulse voltage different from the first and second pre-pulse voltages during a third time period of the setup phase.

13. The method of claim 12, further comprising:
decreasing the voltages applied to the second unselected string selection line and the unselected ground selection line to the off voltage, after the first time period of the setup phase; and
decreasing the voltage applied to the selected word line to the off voltage, after the second time period of the setup phase; and
decreasing the voltage applied to the first unselected string selection line to the off voltage, after the third time period of the setup phase.

14. The method of claim 12, wherein, as a level of the read voltage increases, a level of the second pre-pulse voltage of the selected word line decreases.

15. The method of claim 12, wherein, as a level of the read voltage increases, the second time period decreases.

16. An operation method of a nonvolatile memory device which includes a plurality of cell strings each including a plurality of memory cells connected to a plurality of word lines, a string selection transistor connected to a string selection line, and a ground selection transistor connected to a ground selection line, and the string selection transistor, the plurality of memory cells, and the ground selection transistor of each cell string connected in series, the method comprising:

- receiving a read command and an address from an external device;
- increasing a voltage applied to an unselected string selection line from an off voltage to a first pre-pulse voltage during a first pre-pulse phase of a setup phase, in response to the read command;
- increasing a voltage applied to an unselected ground selection line from the off voltage to the first pre-pulse voltage during the first pre-pulse phase;
- increasing a voltage applied to a selected word line from the off voltage to a second pre-pulse voltage different from the first pre-pulse voltage during a second pre-pulse phase of the setup phase, which is different from the first pre-pulse phase;
- increasing a voltage applied to an unselected word line from the off voltage to a read pass voltage while changing a slope of the voltage applied to the unselected word line, during the setup phase;
- applying a read voltage to the selected word line to read data corresponding to the address, during a sensing phase following the setup phase; and
- outputting the read data through data lines after the sensing phase.

17. The method of claim 16, wherein, as a level of the read voltage increases, the second pre-pulse phase decreases.

18. The method of claim 16, wherein the unselected string selection line is a second unselected string selection line corresponding to the unselected ground selection line, the method further comprising:

- increasing a voltage applied to a first unselected string selection line corresponding to a selected ground selection line from the off voltage to a third pre-pulse voltage different from the first and second pre-pulse voltages during a third pre-pulse phase of the setup phase different from the first and second pre-pulse phases,
- wherein a level of the third pre-pulse voltage is higher than a level of the second pre-pulse voltage.

19. The method of claim 18, further comprising:

- decreasing the voltages applied to the second unselected string selection line and the unselected ground selection line to the off voltage, after the first pre-pulse phase;
- decreasing the voltage applied to the selected word line to the off voltage after the second pre-pulse phase; and
- decreasing the voltage applied to the first unselected string selection line to the off voltage after the third pre-pulse phase.

20. The method of claim 16, wherein, as a level of the read voltage increases, a level of the second pre-pulse voltage of the selected word line decreases.

* * * * *